United States Patent
Hiyama et al.

(10) Patent No.: US 9,676,048 B2
(45) Date of Patent: Jun. 13, 2017

(54) VACUUM SOLDERING APPARATUS AND CONTROL METHOD THEREFOR

(71) Applicant: Senju Metal Industry Co., Ltd., Tokyo (JP)

(72) Inventors: Tsutomu Hiyama, Tokyo (JP);
Hiroyuki Inoue, Saitama (JP);
Shunsuke Kimoto, Tokyo (JP);
Tomotake Kagaya, Chiba (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/108,039

(22) PCT Filed: Dec. 25, 2013

(86) PCT No.: PCT/JP2013/084746
§ 371 (c)(1),
(2) Date: Jun. 24, 2016

(87) PCT Pub. No.: WO2015/097796
PCT Pub. Date: Jul. 2, 2015

(65) Prior Publication Data
US 2016/0339531 A1 Nov. 24, 2016

(51) Int. Cl.
*B23K 37/00* (2006.01)
*B23K 3/08* (2006.01)
(Continued)

(52) U.S. Cl.
CPC ............... *B23K 3/08* (2013.01); *B23K 1/008* (2013.01); *B23K 1/0016* (2013.01); *B23K 1/203* (2013.01);
(Continued)

(58) Field of Classification Search
CPC .... B23K 26/1224; B23K 20/14; B23K 15/06; B23K 1/0016; B23K 3/08; B23K 1/008; B23K 2201/36–2201/42
(Continued)

(56) References Cited

U.S. PATENT DOCUMENTS 6,171,104 B1 * 1/2001 Saito ...................... C30B 29/06
432/128
2007/0048145 A1 3/2007 Ishii et al.
(Continued)

FOREIGN PATENT DOCUMENTS

JP 4220166 A 8/1992
JP 4313295 A 11/1992
(Continued)

*Primary Examiner* — Kiley Stoner
(74) *Attorney, Agent, or Firm* — The Webb Law Firm

(57) ABSTRACT

In a vacuum soldering apparatus and a control method thereof, in order to prevent flux scattering or solder scattering when voids are defoamed and/or deaerated from molten solder by evacuating a chamber to a target degree of vacuum as well as in order to be able to perform brief evacuation, an evaluation control of a pump is performed. The evaluation control of the pump is performed in which the plural evacuation control properties (#1 through #4) with the gradients θ plotting the degrees of vacuum (pressure P) in relation to evacuation time (time t) when a chamber is evacuated by a predetermined pump output, are previously prepared; and the control are changed from evacuation control property of small pump output to evacuation control property of large pump output based on the initially set gradient θ in the evacuation control property.

8 Claims, 19 Drawing Sheets

(51) Int. Cl.
    *B23K 1/00*     (2006.01)
    *B23K 1/008*     (2006.01)
    *B23K 1/20*     (2006.01)
    *H05K 3/34*     (2006.01)
    *F04D 27/02*     (2006.01)
    *F04D 19/04*     (2006.01)
    *B23K 101/42*     (2006.01)

(52) U.S. Cl.
    CPC .......... *F04D 19/04* (2013.01); *F04D 27/0261* (2013.01); *H05K 3/3494* (2013.01); *B23K 2201/42* (2013.01); *H05K 2203/043* (2013.01); *H05K 2203/085* (2013.01); *H05K 2203/1178* (2013.01)

(58) Field of Classification Search
    USPC .......................... 228/218, 221, 102–103, 8–9
    See application file for complete search history.

(56) References Cited

U.S. PATENT DOCUMENTS

| | | | |
|---|---|---|---|
| 2010/0264197 A1* | 10/2010 | Aoyama | B23K 1/08 228/219 |
| 2012/0310421 A1* | 12/2012 | Muhlhaus | C21D 1/74 700/282 |
| 2016/0256946 A1* | 9/2016 | Hiyama | B23K 1/008 |

FOREIGN PATENT DOCUMENTS

| | | | |
|---|---|---|---|
| JP | 9314322 A | | 12/1997 |
| JP | 2005325372 A | * | 11/2005 |
| JP | 2005353965 A | | 12/2005 |
| JP | 2010161207 A | | 7/2010 |
| JP | 2011245527 A | | 12/2011 |
| WO | 2012164776 A1 | | 12/2012 |

\* cited by examiner

FIG. 18

| EVACUATION CONTROL PROPERTY | GRADIENT θx | PUMP OUTPUT CONTROL |
|---|---|---|
| #4→#3→#2→#1 | θ4 | 20Hz→30Hz→40Hz→60Hz (P43→P32→P21) |
| #4→#3→#2 | | 20Hz→30Hz→40Hz (P43→P32) |
| #4→#3→#1 | | 20Hz→30Hz→60Hz (P43→P31) |
| #4→#2→#1 | | 20Hz→40Hz→60Hz (P42→P21) |
| #4→#3 | | 20Hz→30Hz (P43) |
| #4→#2 | | 20Hz→40Hz (P42) |
| #4→#1 | | 20Hz→60Hz (P41) |
| #3→#2→#1 | θ3 | 30Hz→40Hz→60Hz (P32→P21) |
| #3→#2 | | 30Hz→40Hz (P32) |
| #3→#1 | | 30Hz→60Hz (P31) |
| #2→#1 | θ2 | 40Hz→60Hz (P21) |

VACUUM SOLDERING APPARATUS AND CONTROL METHOD THEREFOR

CROSS-REFERENCE TO RELATED APPLICATION

This application is the United States national phase of International Application No. PCT/JP2013/084746 filed Dec. 25, 2013, the disclosure of which is hereby incorporated in its entirety by reference.

TECHNICAL FIELD

The present invention relates to a vacuum soldering apparatus, which has a function to remove voids from vacuum molten solder to be defoamed or deaerated when mounting a surface mounting component or the like on a substrate at a predetermined position thereof and soldering the component and the substrate, and a control method thereof.

BACKGROUND

In the past, voids (air bubbles) generated in a hot blast (air) reflow processing in normal atmospheric pressure during a reflow mounting process of large current device such as mounting process of power device and power module have been held in question. A method of allowing generation of any voids to be more reduced has been required.

FIGS. 19A and 19B are processing diagrams for showing the hot blast reflow processing according to a past example. Cream solder 8 shown in FIG. 19A is applied onto a pad electrode 4 of a substrate 5. The cream solder 8 is formed by adding flux to solder powder so as to have an appropriate viscosity. The cream solder 8 is applied onto the pad electrode 4 of the substrate 5 by a screen printer through a mask.

In this past hot blast reflow, the hot blast reflow processing is performed on the cream solder 8 and when the solder melts, voids 2 are generated in an interior thereof. Such a problem that when the molten solder 7 is cooled and solidified, these voids 2 remain in the solder as they are has occurred.

The following will schematically describe the voids generation in such a hot blast reflow processing condition that the cream solder 8 is applied onto the pad electrode 5 of the substrate 5 but the electronic component is not mounted, with reference to FIGS. 19A and 19B. The solder 3 shown in FIG. 19B is formed so that the molten solder 7 is cooled and spherically solidified by its surface tension after the cream solder 8 shown in FIG. 19A has been subjected to the hot blast reflow process. Circular white portions shown in the drawing indicate the voids 2 which unsatisfactorily occur in the molten solder 7 and remain in the solder 3 after the cooling and solidification thereof. The voids 2 damage heat conduction effects in the power device and the like and cause waste heat to deteriorate.

Regarding the above-mentioned reduction of the voids occurrence, a patent document 1 discloses a soldering apparatus (vacuum reflow apparatus) having a vacuum evacuation function. This solder apparatus is provided with an exhaust valve, a vacuum pump and a treatment chamber. Under the condition in which the substrate is imported into the treatment chamber and the solder on the pad electrode of the substrate is melted, the exhaust valve is opened and the vacuum pump is driven so that the interior of the treatment chamber can be once evacuated. Such a vacuum condition allows any voids which remain in the solder while the solder is melted to be removed by defoaming and/or deaerating effect.

PATENT DOCUMENTS

Patent Document 1: Japanese Patent Application Publication No. Hei09-314322

SUMMARY OF THE INVENTION

Problems to be Solved by the Invention

However, the past vacuum reflow apparatus has the following issues.

(i) As shown in the patent document 1, when performing the soldering, a chamber treatment chamber) is set to be vacuum condition. In this moment, the vacuum pump is driven to create the vacuum condition, in the past system, a method in which vacuum processing time is set and the vacuum pump drives on during the set vacuum processing time in an intent manner.

Accordingly, the voids are removed to be defoamed and/or deaerated by the evacuation but the degree of vacuum continuously varies so that they are suddenly defoamed and/or deaerated. As a result thereof, the voids 2 in the molten solder 7 are broken (burst) during they are defoamed and/or deaerated, and this causes flux scattering, component scattering and solder scattering.

(ii) On the other hand, in an evacuation control property in which evacuation time is plotted in relation to the degree of vacuum, the evacuation control property being obtained by evacuating the chamber at a predetermined pump output, a fact is confirmed such that as an amount of reduced degree of vacuum per unit time varies, stress applied to the voids 2 also varies and this causes the voids 2 to be broken. It is confirmed that the more gentle a gradient in an evacuation control property graph is, the voids 2 is hard to be broken, but there is an issue in which it take a lot of time to reach a specified target degree of vacuum within the chamber if the evacuation control property in which the gradient is gentle in the graph is primarily adopted.

Means for Solving the Problems

In order to solve the above described issues, a vacuum soldering apparatus claimed in claim 1 contains a chamber that is capable of soldering a work under vacuum environment, an operation part that sets a condition of evacuating the chamber, a pump that evacuates the chamber based on the condition of evacuating the chamber, and a control portion that performs an evacuation control of the pump wherein a plurality of evacuation control properties with gradients θ are previously prepared, each gradient θ plotting degree of vacuum in relation to evacuation time when the chamber is evacuated by a predetermined pump output, and the control portion changes from the evacuation control property of small pump output to the evacuation control property of large pump output based on an initially set gradient θ in the evacuation control property.

By the vacuum soldering apparatus according to claim 1, it is possible to enlarge the selectivity of the evacuation conditions and evacuate the chamber to specified set target degrees of vacuum at brief time. On the other hand, it is possible to suppress an occurrence of voids and prevent scattering of flux, components or the like.

In the vacuum soldering apparatus according to claim 1, which is claimed in claim 2, the control portion observes the gradient θ of the evacuation control property to be changed, and the control portion always compares the initially set gradient θ in the evacuation control property with the gradient θ of the evacuation control property to be changed and changes the control from the evacuation control property of small pump output to the evacuation control property of large pump output when both of the gradients θ of the evacuation control properties are agreed with each other in evacuation.

The vacuum soldering apparatus according to claim 1, which is claimed in claim 3, further contains a detection portion that detects vacuum pressure of the chamber and outputs pressure detection information, and a storage portion that stores data in which the evacuation control properties are tabled, wherein the control portion refers to the evacuation control properties based on the pressure detection information, and the control portion changes the pump output from the evacuation control property with the large gradient θ to the evacuation control property with the small gradient θ when the vacuum pressure in the chamber reaches a change point of the degree of vacuum in the evacuation control property.

In the vacuum soldering apparatus according to claim 1, which is claimed in claim 4, the control portion always compares the initially set gradient θ in the evacuation control property with a threshold gradient θth which is a change evaluation criterion, in the evacuation, and the control portion changes the control from the evacuation control property of small pump output to the evacuation control property of large pump output when the initially set gradient θ of the evacuation control property exceeds the threshold gradient θth.

In a control method of a vacuum soldering apparatus claimed in claim 5, a control portion of the vacuum soldering apparatus that solders a work under vacuum environment performs the method containing a step of obtaining and storing a plurality of evacuation control properties with gradients θ, each gradient θ plotting degree of vacuum in relation to evacuation time when a chamber for soldering is evacuated by a predetermined pump output, a step of setting the evacuation control properties with the gradient θ, and a step of controlling the pump output to change from the evacuation control property of small pump output to the evacuation control property of large pump output based on the gradient θ in the set evacuation control properties.

In the control method of the vacuum soldering apparatus according to claim 5, which is claimed in claim 6, the control portion performs a step of obtaining the evacuation control properties at preliminary evacuation to prepare a table, a step of observing the gradient θ of the evacuation control property to be changed at main evacuation, a step of always comparing the initially set gradient θ in the evacuation control property with the gradient θ of the evacuation control property to be changed, and a step of changing the control from the evacuation control property of small pump output to the evacuation control property of large pump output when both of the gradients θ of the evacuation control properties are agreed with each other in evacuation.

In the control method of the vacuum soldering apparatus according to claim 5, which is claimed in claim 7, at preliminary evacuation, the control portion performs a step of obtaining the evacuation control properties to prepare a table, and a step of finding out a change point of the evacuation control properties with the initially set gradient θ, and at main evacuation, the control portion performs a step of detecting the vacuum pressure of the chamber and referring to the tabled evacuation control properties based on the pressure detection information, and a step of changing the pump output from the evacuation control property of the large gradient θ to the evacuation control property of the small gradient θ when the vacuum pressure in the chamber reaches the change point of the evacuation control properties.

In the control method of the vacuum soldering apparatus according to claim 5, which is claimed in claim 8, the control portion always compares the initially set gradient θ in the evacuation control property with a threshold gradient θth which is a change evaluation criterion during evacuation, and the control portion changes the control from the evacuation control property of small pump output to the evacuation control property of large pump output when the initially set gradient θ of the evacuation control property exceeds the threshold gradient θth.

Effects of the Invention

By the vacuum soldering apparatus and the control method thereof according to the present invention, the plurality of the evacuation control properties is previously prepared and the control portion that performs an evacuation control of the pump is provided. The control portion is configured to change from the evacuation control property of small pump output to the evacuation control property of large pump output based on the initially set gradient θ in the evacuation control properties.

By this control, it is possible to enlarge selectivity of evacuation conditions and to evacuate the chamber to a specified target degree of vacuum in grief time. Thereby, it is possible to adjust throughput in the chamber. On the other hand, the voids in the molten solder which reaches the target pressure are gradually defoamed and/or deaerated by the evacuation of the evacuation control properties with the gradient θ which is plotted by the degree of vacuum in relation to evacuation time when the chamber is evacuated by a predetermined pump output. Accordingly, it is possible to prevent flux scattering, solder scattering or the like and to perform a high quality vacuum soldering with decreased voids under a set degree of vacuum.

BRIEF DESCRIPTION OF THE DRAWINGS

FIG. 18 is a table of control data D62 of change points for showing a storage example thereof.

DESCRIPTION OF THE INVENTION

This invention has an object to provide the vacuum soldering apparatus, which can evacuate the chamber to the specified target degree of vacuum in brief time, suppress occurrence of the voids to prevent flux, components or the like from being scattered, and the control method thereof.

Figure 1:
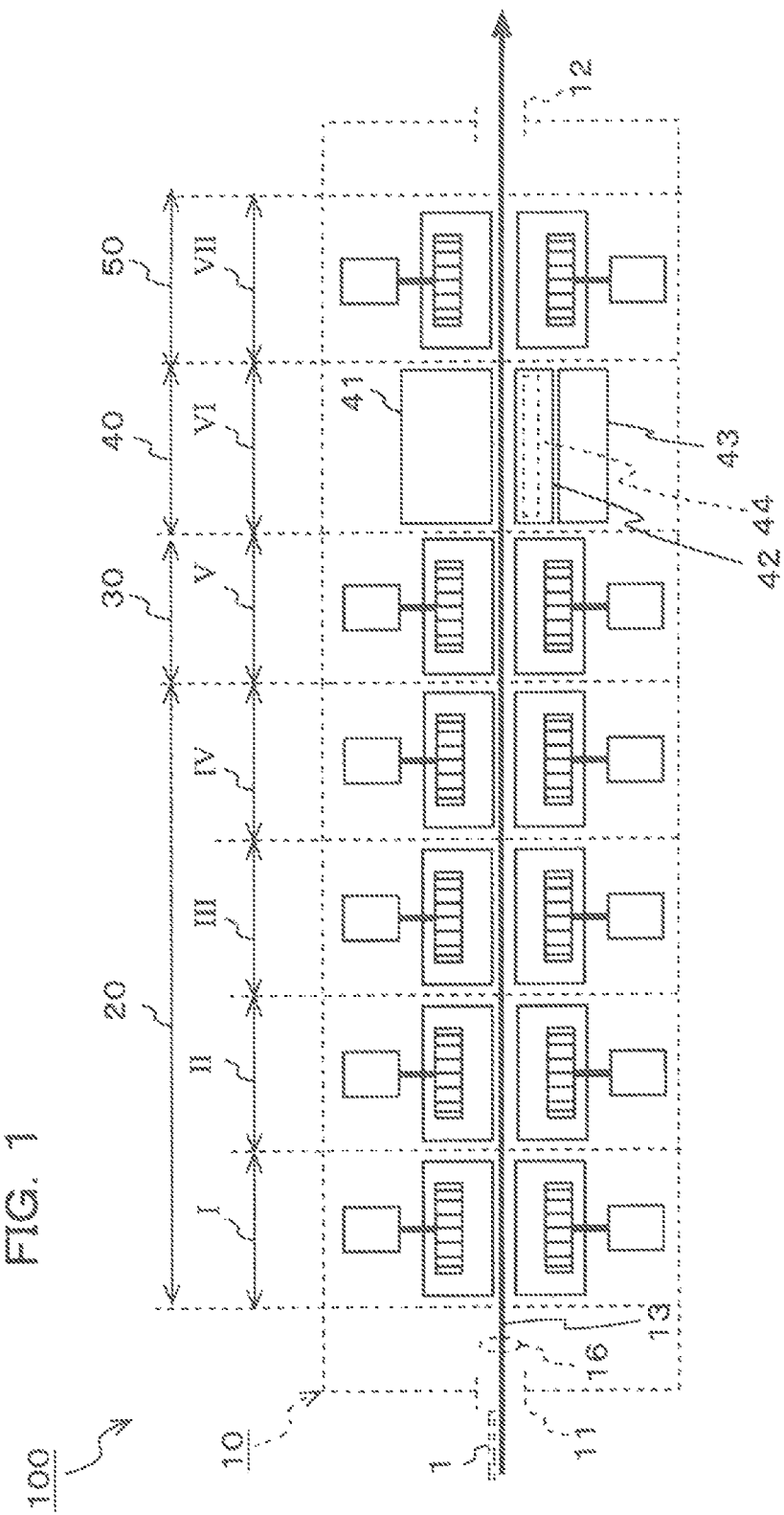
FIG. 1 is a cross sectional view of a vacuum reflow furnace 100 according to an embodiment of the present invention for showing a configuration example thereof.

The following will describe the vacuum soldering apparatus and the control method thereof as embodiments of the invention with reference to the drawings. The vacuum reflow furnace 100 shown in FIG. 1 forms an example of the vacuum soldering apparatus. For example, it is configured so as to perform defoaming/deaerating process under vacuum condition when mounting a surface mounting component such as a power device, a power module or the like on a printed circuit board at a predetermined position and soldering the component and the printed circuit board. An object of the soldering is the printed circuit board, solder coated component, other semiconductor wafer and the like. Hereinafter, they will be generically referred to as "work 1".

The vacuum reflow furnace 100 has a main body 10. The main body portion 1 constitutes a muffle furnace. For example, the main body 10 has a conveying path 16 at an intermediate layer thereof. The main body 10 is divided from a muffle upper portion and a muffle lower portion, not shown, on the basis of the conveying path 16. The main body 10 is provided with a hinge mechanism at rear side thereof and the muffle upper part is lid-opened so that the conveying path can be seen and inspected.

An inlet 11 is provided at a side of the main body 10 and an outlet 12 is provided at the other side thereof. A conveying portion 13 is provided on the conveying path 16 between the inlet 11 and the outlet 12. For the conveying portion 13, in this embodiment, a conveyance mechanism 70 of walking beam type is used (see FIG. 5). According to this conveyance mechanism 70, the work 1 can be intermittently fed at a predetermined velocity. Within the main body 10, a preliminary heating portion 20, a main heating portion 30, the chamber 40 and a cooling portion 50 are arranged in order from the inlet 11 and the work 1 is intermittently fed by being passed through them to reach the outlet 12.

The preliminary heating portion 20 and the main heating portion 30 constitute an example of a heating portion which employs a hot blast circulation heating system. The preliminary heating portion 20 has four preliminary heating zones I through IV which are gradually heated (for example, 150 degrees C. to around 180 degrees C. through 160 and 170 degrees C.) to reach a predetermined temperature (for example, 180 degrees C.). The preliminary heating zones I through IV are arranged upper and lower the conveying path 16. The main heating portion 30 having a main heating zone V is arranged adjacent the preliminary heating portion 20. The main heating zone V heats the work 1 up to around 250 degrees C. before the work 1 enters the chamber 40.

The chamber 40 with vacuum defoaming and/or deaerating zone VI is provided at a position that is adjacent to the main heating portion 30. The chamber 40 performs defoaming/deaerating process under vacuum environment when performing the soldering on the work 1. The chamber 40 shown in FIG. 2 contains a container 41, a base 42 and an elevating mechanism 43. It shows a state where the container 41 is away from the base 42 and stops at a predetermined upper position. Hereinafter, the stop position of the container 41 is referred to as "a home position Hp". The home position Hp is a position where the container 41 is positioned above the base 42 by a height "h" from a reference position thereof. The height "h" may be height such that the work 1 is not hindered from being imported from the main heating portion 30 to the base 42.

The container 41 has a housing structure with the bottom being opened. For example, it is arranged so that a case-like body made of stainless steel is upside down to become a cover. An interior of the container 41 is a cavity (space). The container 41 is configured to move vertically by the elevating mechanism 43. Here, when a conveying direction of the work 1 is set to be "x" direction, a direction that is orthogonal to this conveying direction is set to be "y" direction and a direction that is orthogonal to the "x" and "y" directions is set to be "z" direction, the container 41 moves vertically along this "z" direction when performing any vacuum processing.

The base 42 is arranged under the container 41 and the elevating mechanism 43 is arranged under this base 42. In the elevating mechanism 43, a hydraulically-operated cylinder, a pneumatically-operated cylinder or the like is used. The base 42 has a plane which is broader than an area of the bottom of the container 41 and a predetermined thickness. The base 42 has an airtight seal member 48 at a position that the bottom of the container 41 touches. As the seal member 48 is required to have any heat-resistant properties, fluorine-based packing, for example, is used.

An exhaust port 201 is provided at a predetermined position under the base 42. The exhaust port 201 is contacted with an electromagnetic valve 22 shown in FIG. 4. Further, a gas-supplying port 203 is provided at a predetermined position of a bottom of the base 42. The gas-supplying port 203 is connected with release valves 25 shown in FIG. 4.

In addition, a panel heater 44 is provided at a predetermined position of the base 42. The panel heater 44 constitutes an example of the heating portion and heats the work 1 to a predetermined temperature (around 240 degrees C.) to keep it. This heating is because the predetermined temperature by the main heating portion 30 before the work 1 has entered into the chamber 40 is maintained after the work 1 enters into the chamber 40. Heating system of the panel heater 44 is a far infrared radiation panel system as an example thereof. The panel heater 44 is not limited to that on the base 42: It may be provided at a predetermined position in a side of the container 41.

A pair of fixed beams 45, 46 is provided at a predetermined position of each side on the upper surface of the base 42. The fixed beams 45, 46 form the conveying portion 13. For example, the fixed beam 45 is arranged at a left side end of the upper surface of the base 42 and the fixed beam 46 is arranged at a right side end of the upper surface of the base 42. They are configured to support both sides of the work 1 in the chamber 40.

The fixed beams 45, 46 are composed of plate-like block members and a plurality of pins 47 each having a cone-shaped head are arranged on the upper surface of each of the plate-like block members. In this embodiment, the pins 47 are grouped four by four and stand in line with a predetermined arrangement pitch. They stand in line with the predetermined arrangement pitch is because the works 1 having plural lengths can be supported by them without hindrance corresponding to the works 1 having lengths. Thus, the vacuum reflow furnace 100 is configured.

The cooling portion 50 having a cooling zone VII is provided at an adjacent position of the chamber 40. This is a zone to cool down the work 1 which has been defoamed and/or deaerated (hereinafter, referred to as "vacuum deaerating process") after vacuum-break is performed. The work 1 thus cooled is exported from the apparatus via the outlet 12.

Figure 3A:
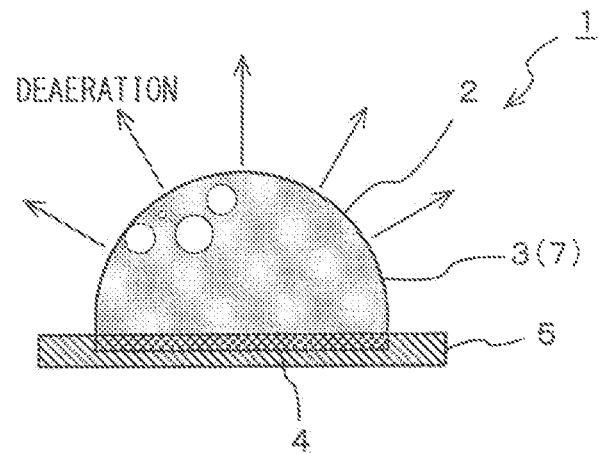
FIG. 3A is a process diagram of a cross section of solder 3 for showing vacuum defoaming and/or deaerating example (Part one).
Figure 3B:
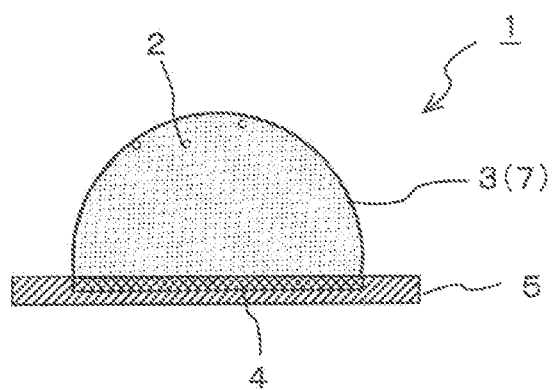
FIG. 3B is a process diagram of a cross section of solder 3 for showing vacuum defoaming and/or deaerating example (Part two).

Here, the following will describe an example of vacuum deaeration from the solder 3 with reference to FIGS. 3A and 3B. In this embodiment, a case where a pad electrode 4 is formed on a substrate 5 such as a printed circuit board, a semiconductor wafer and the like, particularly, a substrate for power device as the work 1 and the solder 3 is formed on this pad electrode 4 will be described. A size of the substrate 5 is of, for example, about 250 mm by about 300 mm (width by length=250 mm*300 mm). Further, a size of the pad electrode 4 of this embodiment is of about 5 mm by about 5 mm.

FIG. 3A shows a condition of molten solder 7 in which the solder 3 has not yet solidified. White shapes (circles or ellipses) shown in the drawing indicate the portions of the voids 2, the shapes of which are considerably grown as the vacuum pressure in the chamber 40 becomes lower (the degree of vacuum becomes higher). The voids 2 are drawn to outside in the evacuation process so that there occurs a difference in the vacuum pressures between the voids 2 and a boundary surface of the solder. The voids 2 in the molten solder 7 come out to outside. (They are defoamed and/or deaerated).

The solder 3 shown in FIG. 3B indicates a melted condition thereof when the vacuum pressure in the container 41 reaches a target pressure (hereinafter, referred to as "set target pressure Pf"). In this invention, a control is performed so that the evacuation control properties are successively changed by the evacuation control having gradients θ, which will be described with reference to FIG. 6, the chamber 40 is evacuated to the set target pressure Pf (specified degree of vacuum), and after the set target pressure Pf which has been previously set is reached, this set target pressure Pf is maintained for a predetermined time.

Thus, since the voids 2 in the molten solder are gradually defoamed and/or deaerated by the evacuation control with the gradients θ until the set target pressure Pf is reached, it is possible to avoid breaking (bursting) the voids 2, which has occurred in past, so that flux scattering and solder scattering occur. After the vacuum break, only voids having small shapes remain in the vicinity of outer surface. In this condition, the work 1 is cooled. Accordingly, the solder 3 in which the voids 2 are decreased can be formed on the pad electrode 4.

Figure 4:
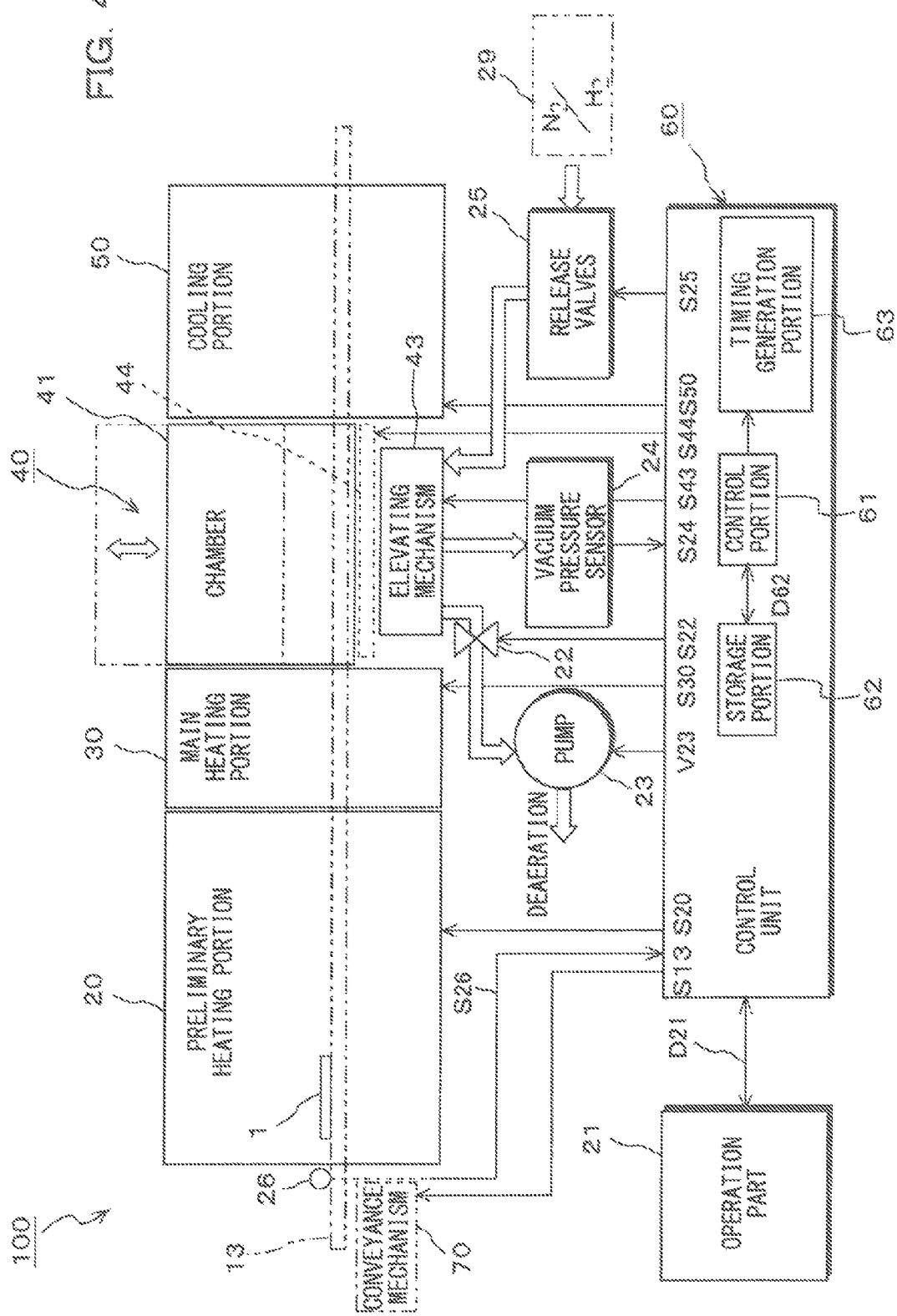
FIG. 4 is a block diagram of a control system of the vacuum reflow furnace 100 for showing a configuration example.

Next, the following will describe a configuration example of a control system of the vacuum reflow furnace 100 with reference to FIG. 4. According to the configuration example of the control system of the vacuum reflow furnace 100, which is shown in FIG. 4, an operation part 21, the electromagnetic valve 22, a pump 23, a vacuum pressure sensor 24, the release valves 25, an arrival sensor 26, the elevating mechanism 43, the panel heater 44, and a control unit 60 are provided for controlling the preliminary heating portion 20, the main heating portion 30, the chamber 40, the cooling portion 50 and the conveyance mechanism 70. The control unit 60 has a control portion 61, a storage portion 62, a timing generation portion 63 and the like.

The operation part 21 is connected with the control unit 60 and allows the evacuation condition such as the set target pressure Pf (for example, Pf=10000 [Pa]) in the chamber 40 during the vacuum deaerating process, the evacuation control properties #1 through #4 with the gradients θx (for example, x=1 through 4) to be input and to be set in the control portion 61. The evacuation control properties #1 through #4 or the like are obtained when the preliminary evacuation other than the main evacuation is performed. A user selects desired evacuation control properties in the order of the highest number (or in the order of smallest frequency of the pump output) among the evacuation control properties #1 through #4 and the like and performs initially setting of the evacuation control properties with the gradients θ.

For the operation part 21, a liquid crystal panel, numeric keys and the like are used. Any setting information indicating the evacuation conditions such as the evacuation control properties with the gradients θ is output to the control portion 61 as operation data D21. Of course, a start button, not shown, is provided in the operation part 21 and instructs a "start" to the control portion 61. The operation part 21 also instructs the control portion 61 to perform the preliminary evacuation when obtaining the evacuation control properties #1 through #4 and the like.

The conveyance mechanism 70 is provided in the conveying portion 13 and is connected with the control unit 60. For the conveyance mechanism 70, a conveyance device of walking beam type is used. The control unit 60 outputs a conveyance control signal S13 to the conveyance mechanism 70. The conveyance control signal S13 is a signal for allowing the moving beams 18, 28 to move and allowing the work 1 to be intermittently fed.

The preliminary heating portion 20 is connected with the control unit 60. The control unit 60 outputs a preliminary heating control signal S20 to the preliminary heating portion 20. The preliminary heating control signal S20 is a signal for allowing heaters, fans and the like in the preliminary heating portion 20 to be driven and controlling four preliminary heating zones I through IV to reach the temperature of the work 1 to at a predetermined temperature (for example, 180 degrees C.).

The main heating portion 30 is connected with the control unit 60. The control unit 60 outputs a main heating control signal S30 to the main heating portion 30. The main heating control signal S30 is a signal for allowing heaters, fans and the like in the main heating portion 30 to be driven and heating the work 1 to 250 degrees C. The elevating mechanism 43 is connected with the control unit 60. The control unit 60 outputs an elevating control signal S43 to the elevating mechanism 43. The elevating control signal S43 is a signal for elevating the container 41.

The panel heater 44 is connected with the control unit 60. The control unit 60 outputs a heater control signal S44 to the panel heater 44. The heater control signal S44 is a signal for maintaining inside of the tightly enclosed container 41 at a predetermined temperature. The electromagnetic valve 22 is connected with the control unit 60. For the electromagnetic valve 22, a throttle valve for vacuum control is used. The control unit 60 outputs an electromagnetic valve control signal S22 to the electromagnetic valve 22. The electromagnetic valve control signal S22 is a signal for controlling valve opening position of the electromagnetic valve 22.

The pump 23 evacuates the chamber 40 based on the evacuation condition. The pump 23 is connected with the control unit 60. For the pump 23, a rotary type vacuum pump (blower), reciprocating vacuum pump (piston) or the like is used. The control unit 60 outputs a pump driving voltage V23 to the pump 23. When using, for example, an alternating current motor, not shown, is used as driving source of the pump 23, a variable voltage variable frequency (VVVF) inverter control system is adopted. According to this control system, voltage almost proportional to number of revolution and frequency f (for example, f=20 Hz through 60 Hz) of the alternative current motor is applied. The pump driving voltage V23 is voltage for controlling the output of the alternative current motor.

The arrival sensor 26 is connected with the control unit 60. The arrival sensor 26 detects that the work 1 enters into the furnace 100 and outputs an arrival detection signal S26 indicating that the work 1 enters into the furnace 100 to the control unit 60. For the arrival sensor 26, a reflection type or transmission type optical sensor is used. In this embodiment, when detecting that the work 1 enters into the furnace 100, the arrival detection signal S26 is output to the control unit 60 to start a timer. A position of the work 1 in the furnace 100 is calculated from a conveying speed of the work 1 and the like based on this timer. In this embodiment in which the work 1 is intermittently fed, since time for intermittently feeding it is previously set, the position of the work 1 may be calculated by the time for intermittently feeding it.

The vacuum pressure sensor 24 is connected with the control unit 60. The vacuum pressure sensor 24 constitutes an example of a detection portion and detects vacuum pressure in the chamber 40 during the defoaming and/deaerating process to generate a vacuum pressure detection signal S24 (pressure detection information). The vacuum pressure detection signal S24 is a signal for indicating the vacuum pressure in the chamber 40 and is output from the vacuum pressure sensor 24 to the control unit 60. For the vacuum pressure sensor 24, a diaphragm vacuum gage, a thermocouple vacuum gage, Pirani vacuum gage, Penning vacuum gage or the like is used.

Figure 2:
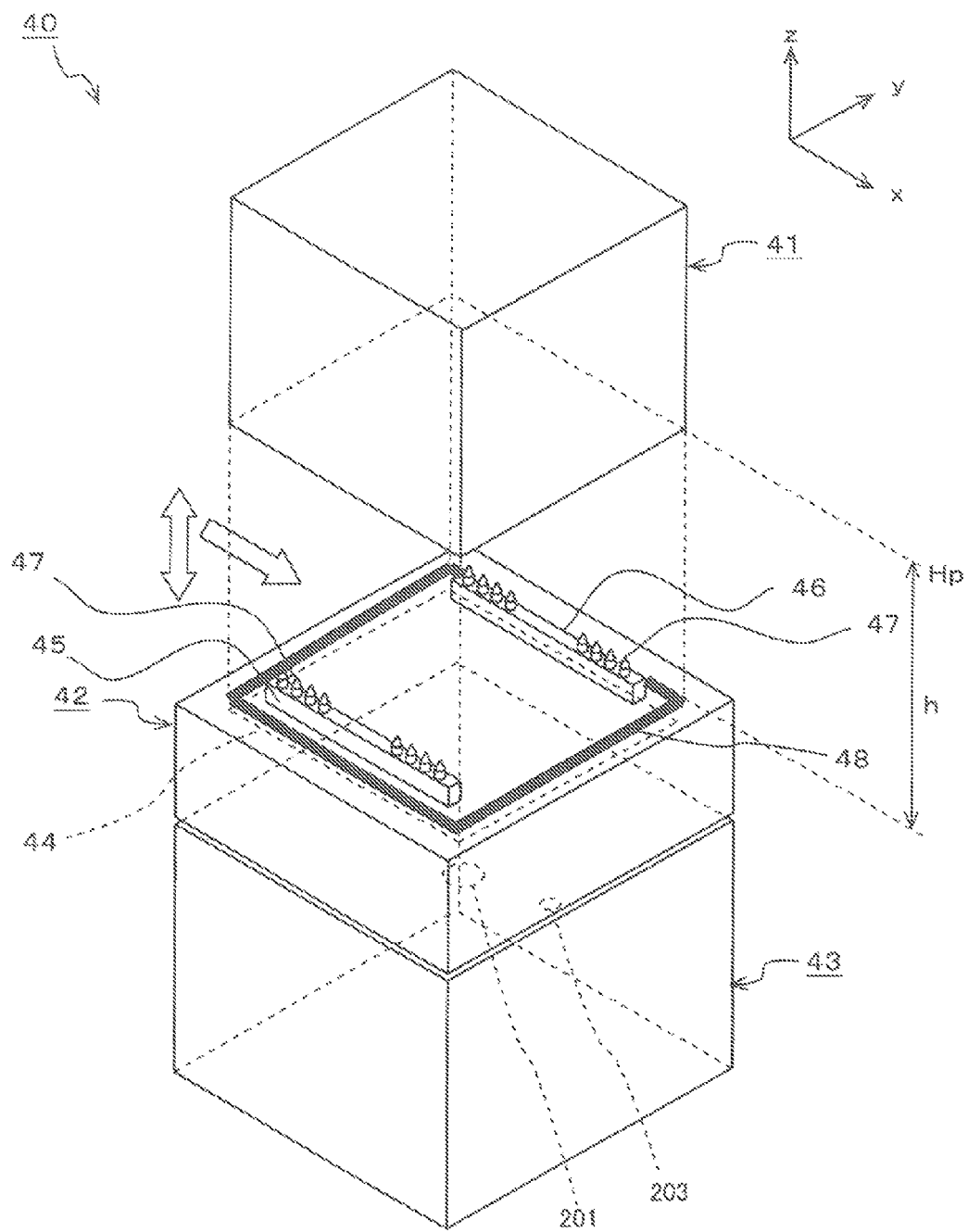
FIG. 2 is a perspective view of a chamber 40 for showing a configuration example thereof.

An end of the release valves 25 is connected with the gas-supplying port 203 of the base 42 shown in FIG. 2 and the other end thereof is connected with a gas-supplying portion 29 such as a nitrogen ($N_2$) gas cylinder, not shown, a hydrogen ($H_2$) gas cylinder, not shown, or the like. The gas-supplying portion 29 has a proportional solenoid valve, not shown. The gas-supplying portion 29 may supply at least one of $N_2$ gas (inert gas) and $H_2$ gas (activated gas for reducing) into the chamber 40. The proportional solenoid valve is configured so as to adjust inflow rate of $N_2$ gas or $H_2$ gas. The control unit 60 outputs a release valves control signal S25 to the release valves 25. The release valves control signal S25 is a signal for controlling the release valves 25.

For the release valves 25, the valves having an initial release valve and a main release valve are used. The initial release valve has a predetermined bore which is smaller than that of the main release valve. The initial release valve is used when limiting the inflow rate of the gas into the chamber 40 or in a preceding operation of the main release valve. The main release valve has a bore which is larger than that of the initial release valve so that the much inflow rate of the gas is passed through it, compared with a case of the initial release valve. Controlling the release valves 25 enables the inside of the chamber 40 to be adjusted to multiple stages of target vacuum pressure (Pa) during vacuum decompression.

The cooling portion 50 is connected with the control unit 60. The control unit 60 outputs a cooling control signal S50 to the cooling portion 50. The cooling control signal S50 is a signal for controlling heat exchangers, fans and the like. The cooling system of the cooling portion 50 is a turbo fan (under nitrogen atmosphere).

The control unit 60 has the control portion 61, the storage portion 62 and the timing generation portion 63. The control unit 60 is also provided with an analog to digital converter, not shown, an oscillator, not shown and the like. The storage portion 62 is connected with the control portion 61 and stores control data D62. The control data D62 is information constituting the evacuation control properties with the gradients θ (for example, θ1 through θ4), each of which plots the evacuation time with regards to the degree of vacuum when evacuating the chamber 40 by a predetermined pump output (see FIG. 6).

In this embodiment, the evacuation control properties #1 through #4 with four gradients θ1 through θ4 are tabled and referred. The control data D62 includes the data for controlling the preliminary heating portion 20, the electromagnetic valve 22, the release valves 25, the main heating portion 30, the elevating mechanism 43, the panel heater 44, the cooling portion 50 and the conveyance mechanism 70, in addition to the data relating to the evacuation control properties #1 through #4. For the storage portion 62, a read only memory (ROM), a random access memory (RAM), hard disk drive (HDD) or the like is used.

For the control portion 61, a central processing unit (CPU) is used. The control data D62 relating to the evacuation control properties #1 through #4 is expanded on RAM. The control portion 61 performs the evacuation control of the pump 23 so that the evacuation control properties are changed from the evacuation control property of small pump output to the evacuation control property of large pump output based on the initially set gradient θ of the evacuation control properties, and selected among the plurality of evacuation control properties #1 through #4 with the gradients θ which have been previously prepared.

For example, the control portion 61 sets a pointer in the storage portion 62 and observes the gradient θ of the evacuation control property to be changed, and the control portion 61 is configured so as to always compare the initially set gradient θ in the evacuation control property with the gradient θ of the evacuation control property to be changed and the like and change from the evacuation control property of small pump output to the evacuation control property of large pump output when both of the gradients θ of the evacuation control properties are agreed with each other during the evacuation.

Of course, the control portion 61 adjusts the degree of vacuum based on the vacuum pressure detection signal S24 and controls the electromagnetic valve 22 and the release valves 25 in addition to the pump 23 to maintain the degree of vacuum for a predetermined time. Thereby, it is possible to enlarge selectivity of the evacuation conditions and evacuate the chamber to the specified set target pressure Pf at brief time. The voids 2 in the molten solder 7 can be gradually defoamed and/or deaerated. Therefore, it is possible to prevent flux scattering, solder scattering or the like by breaking (bursting) the voids 2.

The timing generation potion 63 other than the storage portion 62 is connected with the control portion 61. The timing generation potion 63 receives a reference clock signal obtained from an oscillator, not shown, and a control instruction from the control portion 61. The timing generation potion 63 generates the preliminary heating control signal S20, the electromagnetic valve control signal S22, the release valves control signal S25, the main heating control signal S30, the elevating control signal S43, the heater control signal S44, the cooling control signal S50 and a conveyance control signal S13. Thus, the control system of the vacuum reflow furnace 100 is configured.

Figure 5:
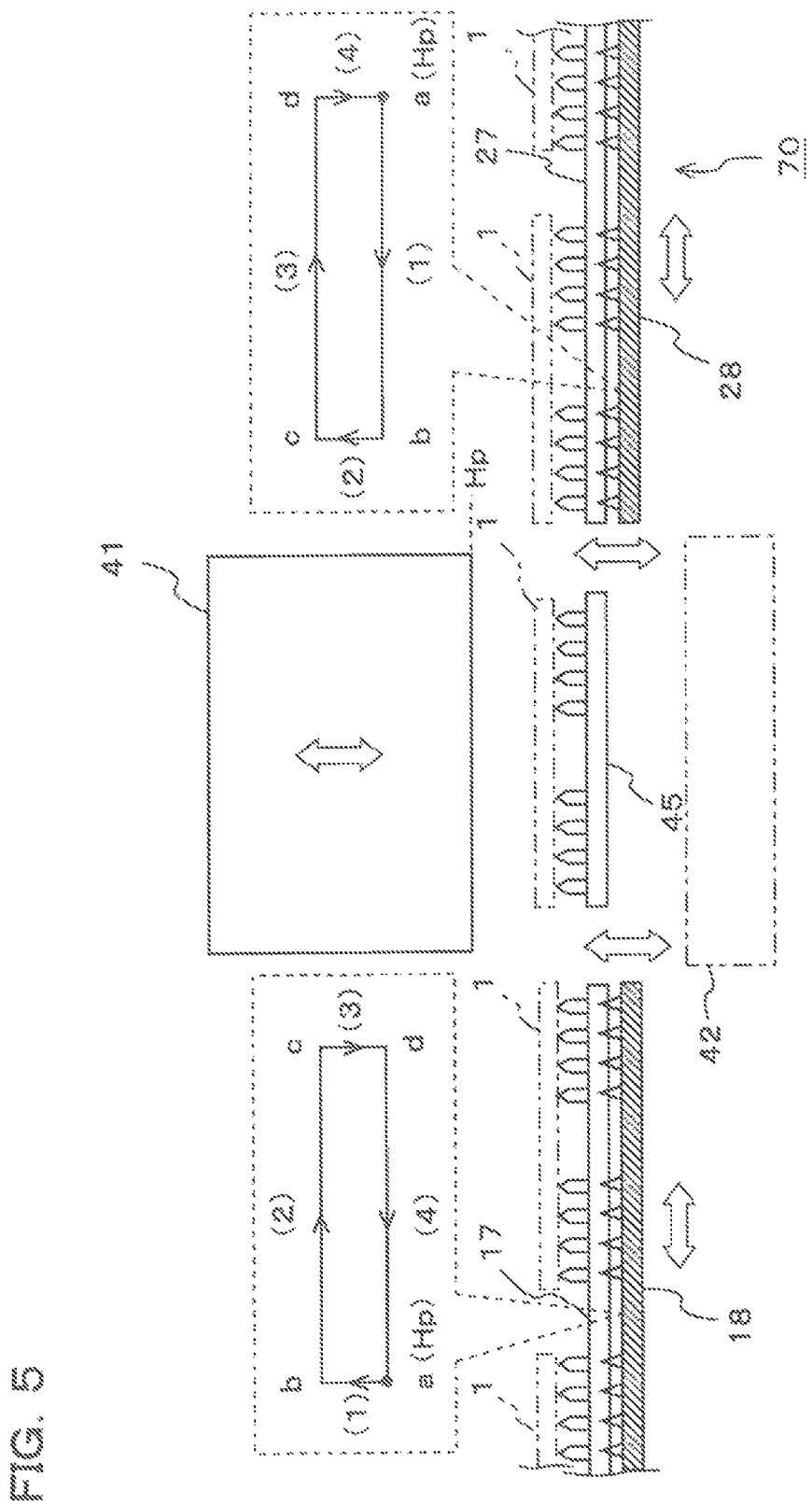
FIG. 5 is a cross sectional view of a conveying portion 13 for showing a configuration example thereof.

The following will describe a configuration example of the conveyance mechanism 70 with reference to FIG. 5. In FIG. 5, the conveyance mechanism 70 of walking beam type has fixed beams 17, 27 and moving beams 18, 28. Feeding pitch of the moving beam 18, 28 is about 400 mm. Here, on the basis of the chamber 40, a side in which the work 1 is imported is set to be an "import side" and a side in which the work 1 is exported is set to be an "export side". The fixed beam 17 of the import side is provided in the preliminary heating portion 20 and the main heating portion 30. The fixed beam 27 of the export side is provided in the cooling portion 50.

Pairs of the fixed beams 17, 27 are provided on both sides of the conveying path 16 one by one. The moving beams 18, 28 operate to move up and down, right and left on the fixed beams 17, 27 of both sides (refer to loci (1) through (4) in the drawing: this is a walking). A code, "a" indicates a home position of each of the moving beams 18, 28. The moving beams 18, 28 are respectively configured to drive independently at the import side and the export side.

For example, the moving beams 18 of the import side rises vertically (from the code, "a" to a code "b") along the locus (1) and receives the work 1 from the fixed beam 17 (fixed beam 45). Next, it moves horizontally (from the code, "b" to a code "c") along the locus (2) with mounting the work 1; it falls down vertically (from the code, "c" to a code "d") along the locus (3) and mounts the work 1 on the fixed beam 17 (fixed beam 45); it then moves horizontally (from the code, "d" to the code "a") along the locus (4) and returns to the home position Hp. Thus, it intermittently feeds the work 1 successively.

In addition, the moving beams 28 of the export side moves horizontally (from the code, "a" to the code "b") along the locus (1). Next, it rises vertically (from the code, "b" to the code "c") along the locus (2). This allows the moving beams 28 to receive the work 1 from the fixed beam 45 (fixed beam 27). It then moves horizontally (from the code, "c" to the code "d") along the locus (3) with mounting the work 1. It then falls down vertically (from the code, "d" to the code "a") along the locus (4) and mounts the work 1 on the fixed beam 27 and it then returns to the home position Hp. Thus, it intermittently feeds the work 1 successively at a predetermined velocity (on the drawing, the work 1 is fed successively from a left side to a right side). Accordingly, the conveyance mechanism 70 of walking beam type is configured.

Figure 6:
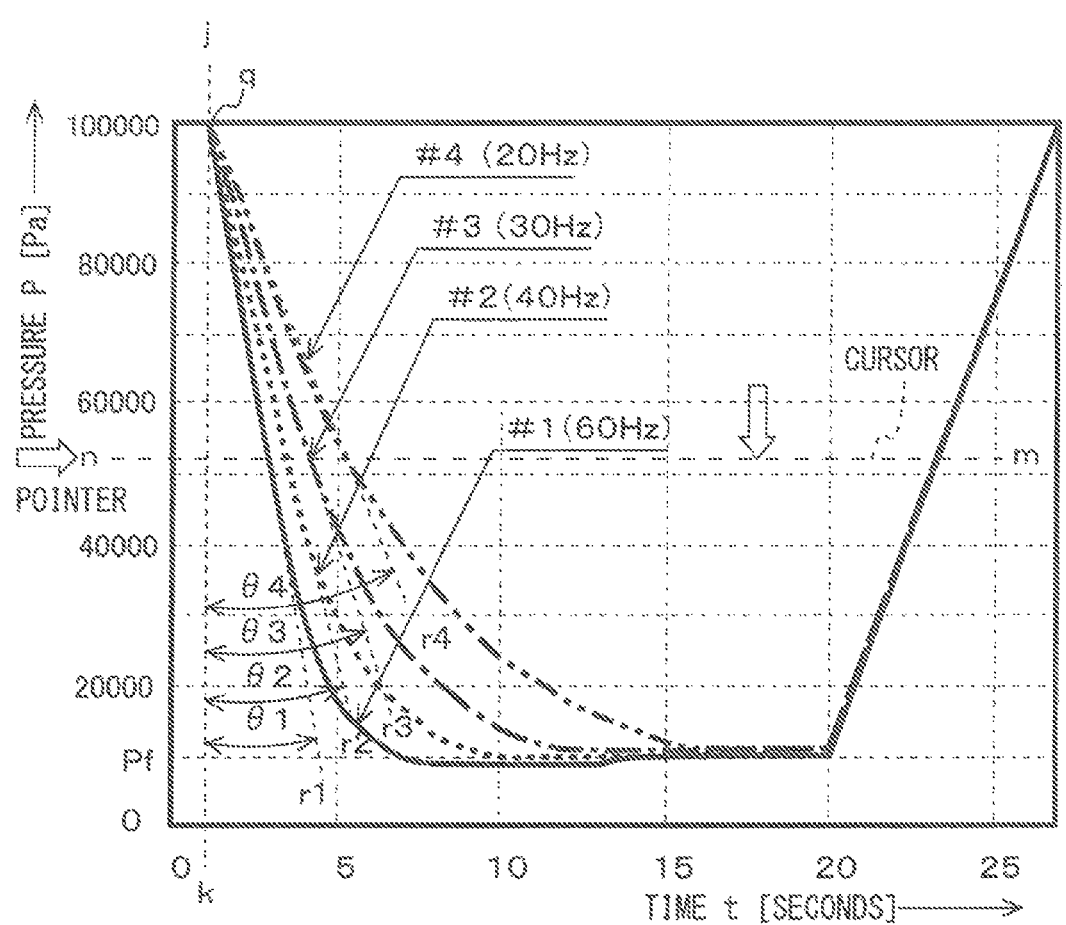
FIG. 6 is a graph showing an obtained example of evacuation control properties #1 through #4.

The following will describe an obtained example of evacuation control properties #1 through #4 with reference to FIG. 6. In this embodiment, the evacuation control properties #1 through #4 are obtained during preliminary evacuation time. The preliminary evacuation time is referred to as time other than main evacuation time. In FIG. 6, a vertical axis indicates pressure P [Pa] (degree of vacuum) in the chamber. A horizontal axis thereof indicates time [second] which is required for the evacuation. Pf indicates the set target pressure which is 10000 [Pa], in this embodiment. Further, the time t when the container 41 starts to move toward the side of the base 42 by the elevating mechanism 43 in order to enclose the chamber 40 is set to be zero (t=0) in a time axis shown in FIG. 6. The time t when the chamber 40 is enclosed is set to be k (t=k). The evacuation actually starts since t=k. The following elapsed time is illustrated on the basis of t=k.

In this embodiment, a solid line indicates the evacuation control property #1 in a case where the alternative current motor is driven at a frequency of 60 Hz (f=60 Hz), the pump 23 is operated to evacuate the chamber 40. The control property #1 is a property where it is possible to evacuate the chamber 40 by taking about 6 [seconds] to reach the set target pressure Pf. A broken line indicates the evacuation control property #2 in a case where the pump 23 is similarly operated at a frequency of 40 Hz (f=40 Hz) to evacuate the chamber 40. The control property #2 is a property where it is possible to evacuate the chamber 40 by taking about 9 [seconds] to reach the set target pressure Pf.

An alternate long and short dash line indicates the evacuation control property #3 in a case where the pump 23 is similarly operated at a frequency of 30 Hz (f=30 Hz) to evacuate the chamber 40. The control property #3 is a property where it is possible to evacuate the chamber 40 by taking about 11 [seconds] to reach the set target pressure Pf. An alternate long and two short dashes line indicates the evacuation control property #4 in a case where the pump 23 is similarly operated at a frequency of 20 Hz (f=20 Hz) to evacuate the chamber 40. The control property #4 is a property where it is possible to evacuate the chamber 40 by taking about 16 [seconds] to reach the set target pressure Pf.

Frequency f for obtaining the pump output Po1 is 60 Hz; Frequency f for obtaining the pump output Po2 is 40 Hz; Frequency f for obtaining the pump output Po3 is 30 Hz; Frequency f for obtaining the pump output Po4 is 20 Hz. Magnitude correlation of these pump outputs Po1 through Po4 is indicated as Po1>Po2>Po3>Po4 in a case of pump output Po; 60 Hz>40 Hz>30 Hz>20 Hz in a case of the frequency f.

A gradient $\theta 1$ in the drawing is a gradient of the evacuation control property #1. The gradient $\theta 1$ is an angle formed by a segment j-k (shown by the broken line) which is parallel with the vertical axis and a tangential line (broken line q-r1) of a graph of the evacuation control property #1. A start point of the tangential line q-r1 is a start point q (100000 [Pa]) of the graph at the evacuation start time. A gradient $\theta 2$ is a gradient of the evacuation control property #2 defined by the tangential line q-r2, which is similar to the gradient $\theta 1$. Similarly, a gradient $\theta 3$ is a gradient of the evacuation control property #3 defined by the tangential line q-r3. A gradient $\theta 4$ is similarly a gradient of the evacuation control property #4 defined by the tangential line q-r4. There is a relationship of $\theta 1 < \theta 2 < \theta 3 < \theta 4$ among the gradients $\theta 1$, $\theta 2$, $\theta 3$, $\theta 4$ of the evacuation control properties #1 through #4.

The gradient θ=θ1, θ2, θ3, θ4 is a decreased amount of degree of vacuum per unit time and is obtained by tan (90 degree−θ)=degree of vacuum/time required therefor. It is to be noted that the segment j-k is referenced because t=k from which the evacuation actually starts is set to be a start point of the elapsed time, which has been described above.

In this embodiment, four evacuation control properties #1 through #4 obtained at the preliminary evacuation time are expanded on the storage portion 62 (RAM or the like). The evacuation control properties #1 through #4 are expanded on the same memory space with the above-mentioned start point q being repeated. A thick broken line n-m in the drawing indicates a cursor which is used for looking for a next point of frequency f (a change point of the control properties). For example, the cursor n-m is scrolled toward a direction shown by an arrow defined by outlines (downward) at the same time as the start of the evacuation. The scroll is realized by a fact such that CPU or the like of the control portion 61 sets a pointer on RAM or the like. This scroll is performed for performing the vacuum soldering process so that when initially setting the gradient θ, the pointer runs and the evacuation control property with the initially set gradient θ is successively changed to a next evacuation control property in which the same gradient θ as the initially set gradient θ of the evacuation control property is detected (see Executed Examples 1 through 5)

First Executed Example

Figure 7:
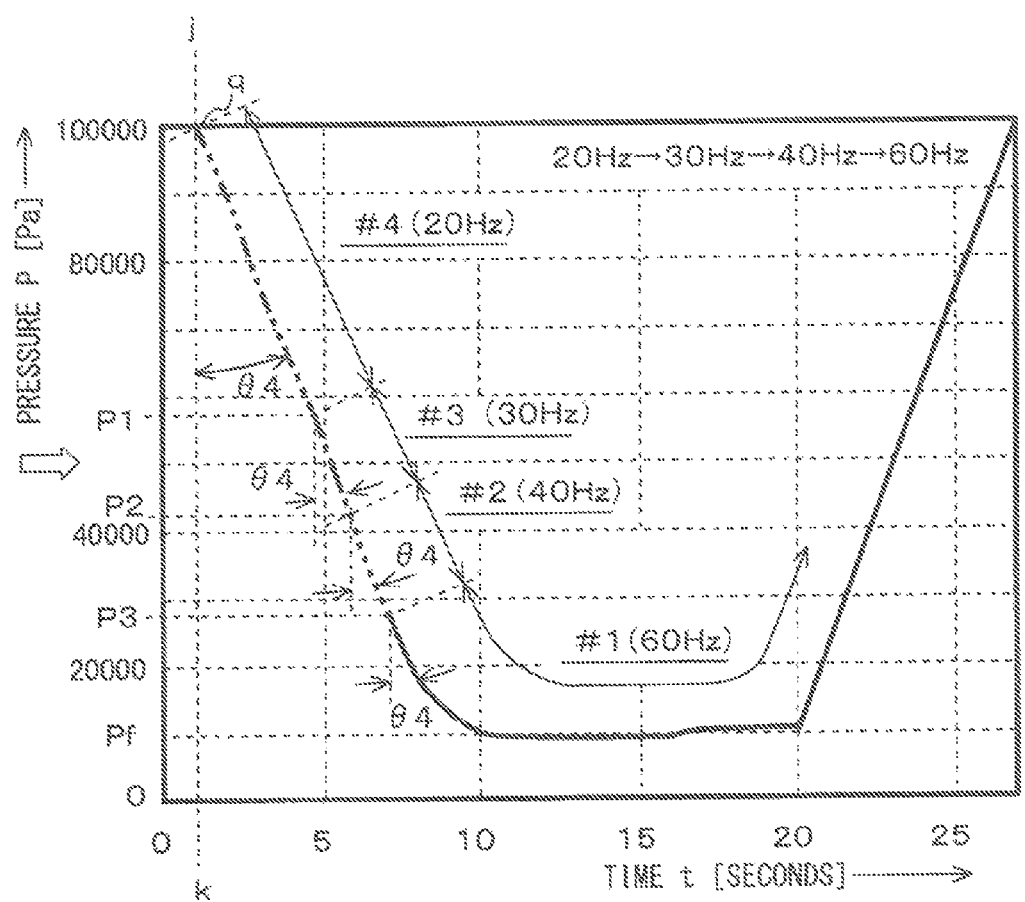
FIG. 7 is a graph showing a control example (20 Hz to 60 Hz through 30 Hz and 40 Hz) of the chamber 40.

According to a control example (Part One) of the chamber 40 shown in FIG. 7, four evacuation control properties #1 through #4 are illustratively selected. In the evacuation of the chamber 40, the frequency of the pump driving system is controlled so as to be gradually increased so that the frequency is increased from 20 Hz to 60 Hz through 30 Hz and 40 Hz, thereby changing the evacuation control properties in order from #4 to #1 to perform pump output control.

The pump 23 is driven following the evacuation control property #4 with the gradient θ4 at the same time as the control starts. The pump is driven at the frequency f of 20 Hz (f=20 Hz) for about 3.5 seconds. On the other hand, the control portion 61 sets the pointer shown in FIG. 6 at the same time as the evacuation starts to scroll the cursor n-m. The gradient θ4 of the graph in the next evacuation control property #3 is detected.

This example is a case where the change point in which the gradient of the graph in the evacuation control property #3 becomes θ4 is detected at pressure P1 of 57000 [Pa] (P1=57000 [Pa]). At the point of the pressure P1 in which the gradient θ4 is detected, the control is successively changed from the evacuation control property #4 to the evacuation control property #3 (First Control Change). The initially setting gradient θ4 is kept even in the evacuation control property #3.

The pump 23 is driven following the evacuation control property #3 (30 Hz) at the same time of the first control change. The pump 23 is driven at the frequency f of 30 Hz (f=30 Hz) for about 1.5 seconds following the former frequency f of 20 Hz (f=20 Hz). On the other hand, the control portion 61 continue to scroll the cursor n-m shown in FIG. 6 after the first control change, thereby detecting the gradient θ4 of the graph in the evacuation control property #2.

This example is a case where the change point in which the gradient of the graph in the evacuation control property #2 becomes θ4 is detected at pressure P2 of 43000 [Pa] (P2=43000 [Pa]). At a point of the pressure P2 in which the gradient θ4 is detected, the control is changed from the evacuation control property #3 to the evacuation control property #2 (Second Control Change). The initially setting gradient θ4 is kept even in the evacuation control property #2.

The pump 23 is driven following the evacuation control property #2 (40 Hz) at the same time of the second control change. The pump 23 is driven at the frequency f of 40 Hz (f=40 Hz) for about 1.5 seconds following the former frequency f of 30 Hz (f=30 Hz). On the other hand, the control portion 61 continue to scroll the cursor n-m shown in FIG. 6 after the second control change, thereby detecting the gradient θ4 of the graph in the evacuation control property #1.

This example is a case where the change point in which the gradient of the graph in the evacuation control property #1 becomes θ4 is detected at pressure P3 of 27000 [Pa] (P3=27000 [Pa]). At a point of the pressure P3 in which the gradient θ4 is detected, the control is changed from the evacuation control property #2 to the evacuation control property #1 (Third Control Change). The initially setting gradient θ4 is kept even in the evacuation control property #1. The pump 23 is driven at f=60 Hz for the rest of the time following the frequency f of 40 Hz (f=40 Hz).

Accordingly, the initially setting gradient θ4 is kept, namely, the evacuation control properties are successively changed in order from #4 to #1 through #2 and #3 while the decreased amount of degree of vacuum per unit time is kept constant, thereby enabling the chamber 40 to be evacuated to the specified set target pressure Pf in brief time. In this example, it takes about 9 [seconds] to start the evacuation of the chamber 40 and reach the set target pressure Pf. Here, successive changes of the control properties are referred to as, for example, at detection time of the gradient θ4, "changes in which a graph of the evacuation control property #4 shown in FIG. 6 below the pressure P1 is cut; a graph of the evacuation control property #3 over the pressure P1 is cut and the cut one of the evacuation control property #3 is shifted to right side so that the graph of the evacuation control property #4 and the graph of the evacuation control property #3 are combined". Other case also should be similarly understood.

Second Executed Example

Figure 8:
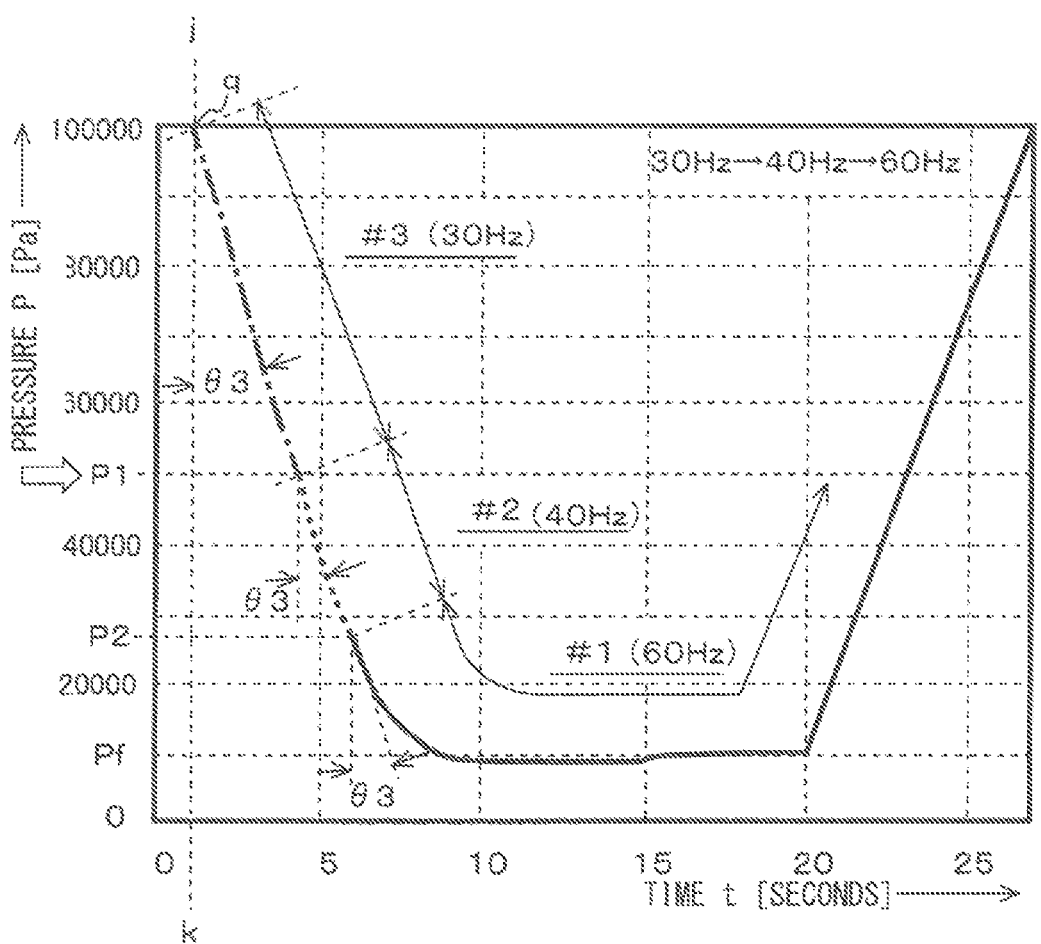
FIG. 8 is a graph showing a control example (30 Hz to 60 Hz through 40 Hz) of the chamber 40.

According to a control example (Part Two) of the chamber 40 shown in FIG. 8, three evacuation control properties #1 through #3 are illustratively selected. In the evacuation of the chamber 40, the frequency of the pump driving system is controlled so as to be gradually increased so that the frequency is increased from 30 Hz to 60 Hz through 40 Hz, thereby changing the evacuation control properties in order from #3 to #1 to perform pump output control.

The pump 23 is driven following the evacuation control property #3 (30 Hz) with the gradient θ3 at the same time as the control starts. The pump is driven at the frequency f of 30 Hz (f=30 Hz) for about 3.5 seconds. On the other hand, the control portion 61 scrolls the cursor n-m, which is similar to the executed example 1, and detects the gradient θ3 of the graph in the next evacuation control property #2.

This example is a case where the change point in which the gradient of the graph in the evacuation control property #2 becomes θ3 is detected at pressure P1 of 50000 [Pa] (P1=50000 [Pa]). At a point of the pressure P1 in which the gradient θ3 is detected, the control is successively changed from the evacuation control property #3 to the evacuation control property #2 (First Control Change). The initially setting gradient θ3 is kept even in the evacuation control property #2.

The pump 23 is driven following the evacuation control property #2 (40 Hz) at the same time of the first control change. The pump 23 is driven at the frequency f of 40 Hz (f=40 Hz) for about 1.5 seconds following the former frequency f of 30 Hz (f=30 Hz). On the other hand, the control portion 61 continue to scroll the cursor n-m similarly after the first control change, thereby detecting the gradient θ3 of the graph in the evacuation control property #1.

This example is a case where the change point in which the gradient of the graph in the evacuation control property #1 becomes θ3 is detected at pressure P2 of 27000 [Pa] (P2=27000 [Pa]). At a point of the pressure P2 in which the gradient θ3 is detected, the control is changed from the evacuation control property #2 to the evacuation control property #1 (Second Control Change). The initially setting gradient θ3 is kept even in the evacuation control property #1. The pump 23 is driven at f=60 Hz for the rest of the time following the frequency f of 40 Hz (f=40 Hz).

Accordingly, while the initially setting gradient θ3 is kept, the evacuation control properties are successively changed in order from #3 to #1 through #2, thereby enabling the chamber 40 to be evacuated to the specified set target pressure Pf in brief time. In this example, it takes about 8 [seconds] to start the evacuation of the chamber 40 and reach the set target pressure Pf.

Third Executed Example

Figure 9:
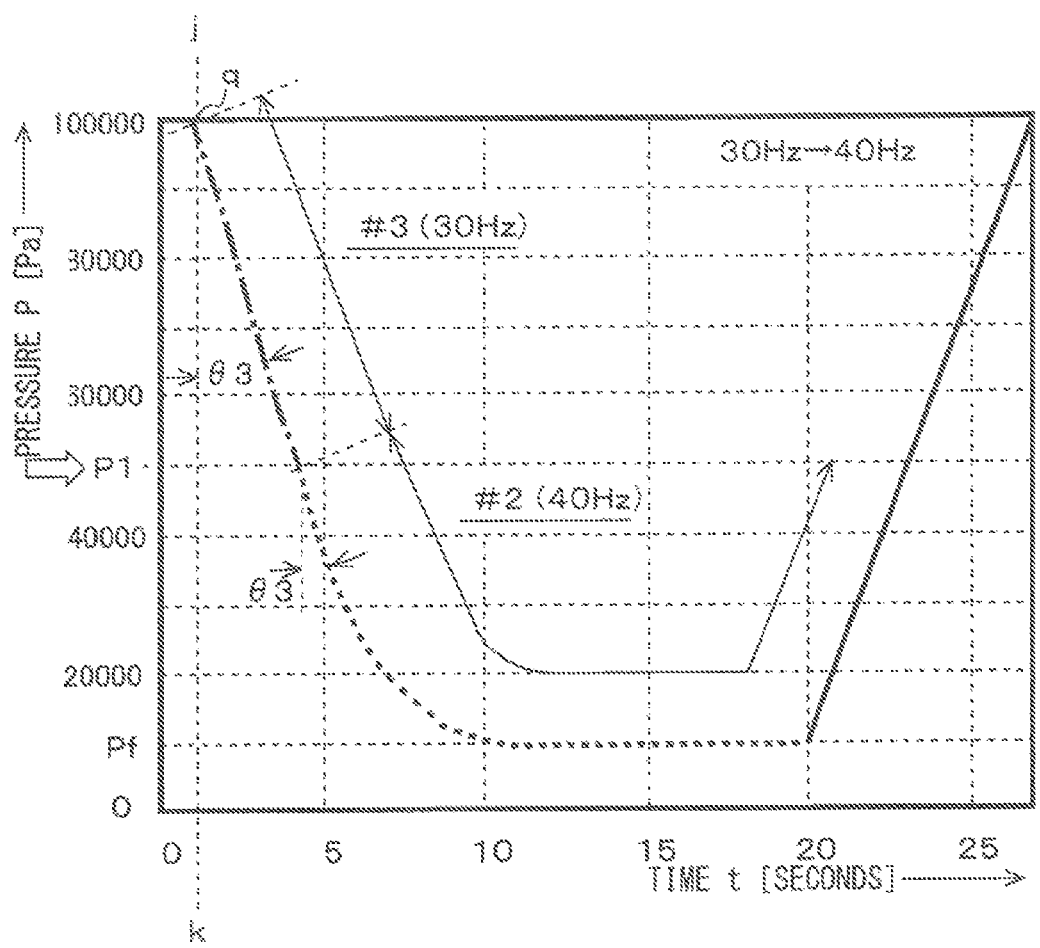
FIG. 9 is a graph showing a control example (30 Hz to 40 Hz) of the chamber 40.

According to a control example (Part Three) of the chamber 40 shown in FIG. 9, two evacuation control properties #2 and #3 are illustratively selected. In the evacuation of the chamber 40, the frequency of the pump driving system is controlled by two stages from 30 Hz to 40 Hz so that the evacuation control properties are changed from #3 to #2 to perform pump output control.

The pump 23 is driven following the evacuation control property #3 (30 Hz) with the gradient θ3 at the same time as the control starts, which is similar to the executed example 2. The pump is driven at the frequency f of 30 Hz (f=30 Hz) for about 3.5 seconds. On the other hand, the control portion 61 scrolls the cursor n-m, which is similar to the executed example 2, and detects the gradient θ3 of the graph in the next evacuation control property #2.

This example is a case where the change point in which the gradient of the graph in the evacuation control property #2 becomes θ3 is detected at pressure P1 of 50000 [Pa] (P1=50000 [Pa]). At a point of the pressure P1 in which the gradient θ3 is detected, the control is successively changed from the evacuation control property #3 to the evacuation control property #2. The initially setting gradient θ3 is kept even in the evacuation control property #2.

The pump 23 is driven following the evacuation control property #2 (40 Hz) at the same time of this control change. The pump 23 is driven at the frequency f of 40 Hz (f=40 Hz) for the rest of the time following the former frequency f of 30 Hz (f=30 Hz). Accordingly, while the initially setting gradient θ3 is kept, the evacuation control properties are successively changed from #3 to #2, thereby enabling the chamber 40 to be evacuated to the specified set target pressure Pf in brief time. In this example, it takes about 9 [seconds] to start the evacuation of the chamber 40 and reach the set target pressure Pf.

Fourth Executed Example

Figure 10:
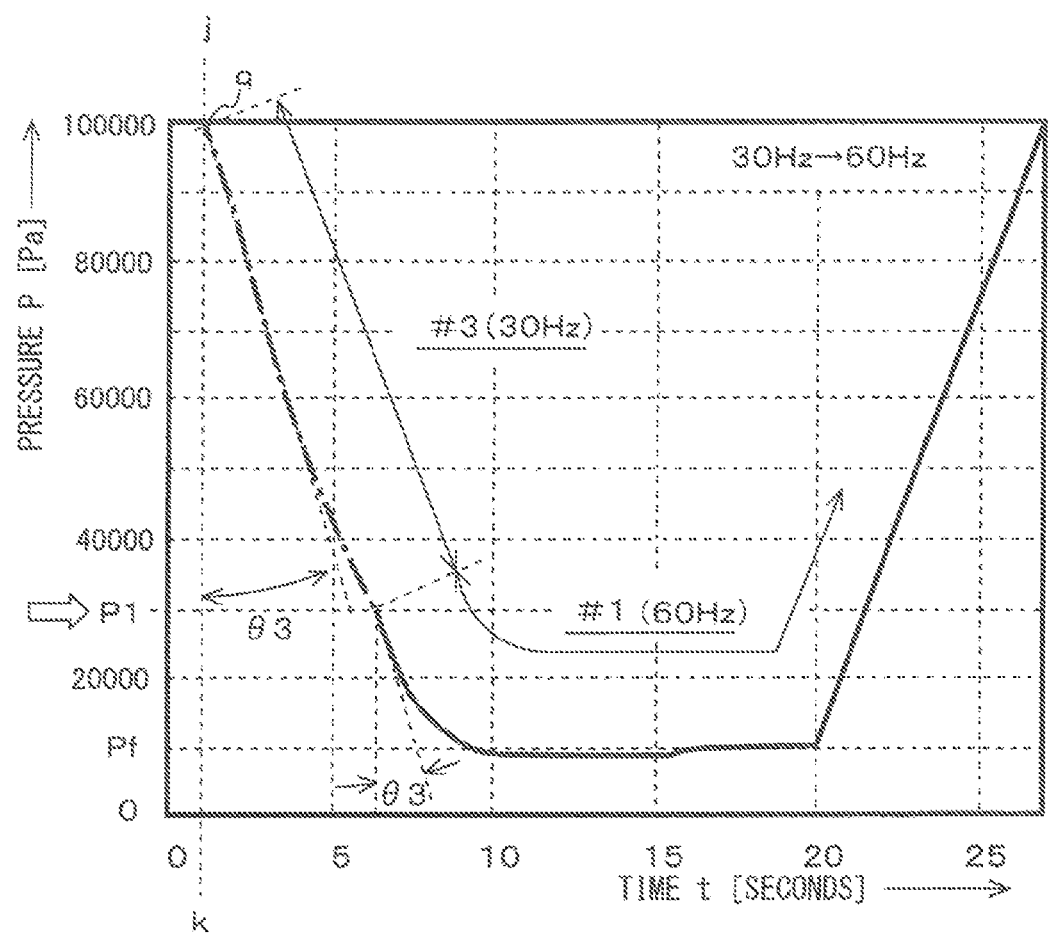
FIG. 10 is a graph showing a control example (30 Hz to 60 Hz) of the chamber 40.

According to a control example (Part Four) of the chamber 40 shown in FIG. 10, two evacuation control properties #1 and #3 are illustratively selected. In the evacuation of the chamber 40, the frequency of the pump driving system is controlled by two stages from 30 Hz to 60 Hz so that the evacuation control properties are changed from #3 to #1 to perform pump output control.

The pump 23 is driven following the evacuation control property #3 (30 Hz) with the gradient θ3 at the same time as the control starts, which is similar to the executed example 2, 3. The pump 23 is driven at the frequency f of 30 Hz (f=30 Hz) for about 5.5 seconds. On the other hand, the control portion 61 scrolls the cursor n-m, which is similar to the executed example 2, 3, and detects the gradient θ3 of the graph in the next evacuation control property #1.

This example is a case where the change point in which the gradient of the graph in the evacuation control property #1 becomes θ3 is detected at pressure P1 of 30000 [Pa] (P1=30000 [Pa]). At a point of the pressure P1 in which the gradient θ3 is detected, the control is successively changed from the evacuation control property #3 to the evacuation control property #1. The initially setting gradient θ3 is kept even in the evacuation control property #1.

The pump 23 is driven following the evacuation control property #1 (60 Hz) at the same time of this control change. The pump 23 is driven at the frequency f of 60 Hz (f=60 Hz) for the rest of the time following the former frequency f of 30 Hz (f=30 Hz). Accordingly, while the initially setting gradient θ3 is kept, the evacuation control properties are successively changed from #3 to #1, thereby enabling the chamber 40 to be evacuated to the specified set target pressure Pf in brief time. In this example, it takes about 8 [seconds] to start the evacuation of the chamber 40 and reach the set target pressure Pf.

Fifth Executed Example

Figure 11:
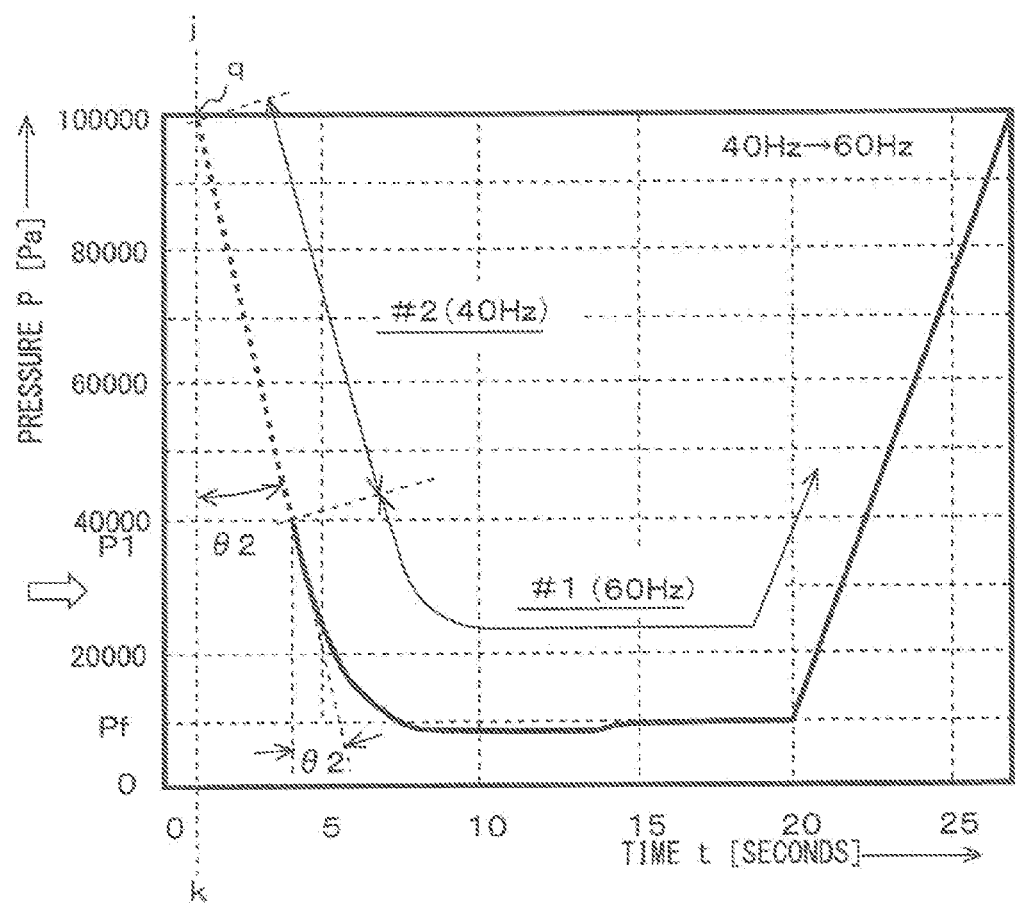
FIG. 11 is a graph showing a control example (40 Hz to 60 Hz) of the chamber 40.

According to a control example (Part Five) of the chamber 40 shown in FIG. 11, two evacuation control properties #1 and #2 are illustratively selected. In the evacuation of the chamber 40, the frequency of the pump driving system is controlled by two stages from 40 Hz to 60 Hz so that the evacuation control properties are changed from #2 to #1 to perform pump output control.

The pump 23 is driven following the evacuation control property #2 (40 Hz) with the gradient θ2 at the same time as the control starts. The pump 23 is driven at the frequency f of 40 Hz (f=40 Hz) for about 3 seconds. On the other hand, the control portion 61 scrolls the cursor n-m, which is similar to the executed example 2, 3, 4, and detects the gradient θ2 of the graph in the next evacuation control property #1.

This example is a case where the change point in which the gradient of the graph in the evacuation control property #1 becomes θ2 is detected at pressure P1 of 40000 [Pa] (P1=40000 [Pa]). At a point of the pressure P1 in which the gradient θ2 is detected, the control is successively changed from the evacuation control property #2 to the evacuation control property #1. The initially setting gradient θ2 is kept even in the evacuation control property #1.

The pump 23 is driven following the evacuation control property #1 (60 Hz) at the same time of this control change. The pump 23 is driven at the frequency f of 60 Hz (f=60 Hz) for the rest of the time following the former frequency f of 40 Hz (f=40 Hz). Accordingly, while the initially setting gradient θ2 is kept, the evacuation control properties are successively changed from #2 to #1, thereby enabling the chamber 40 to be evacuated to the specified set target pressure Pf in brief time. In this example, it takes about 6.5 [seconds] to start the evacuation of the chamber 40 and reach the set target pressure Pf.

Figure 12:
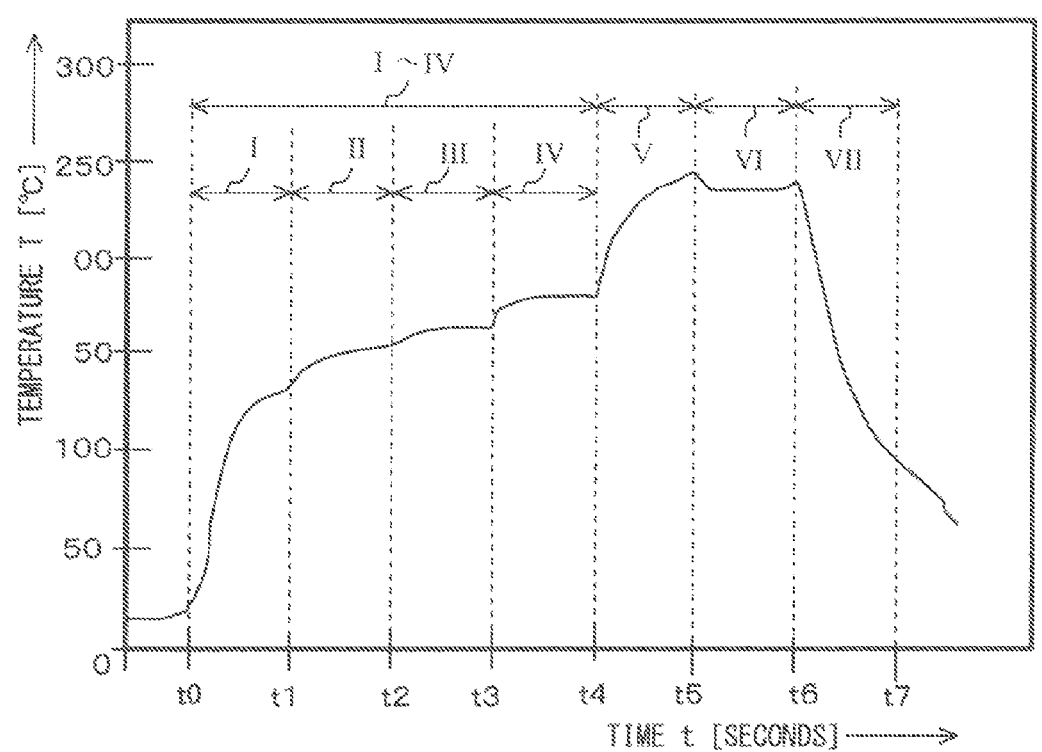
FIG. 12 is a graph showing a temperature profile of the vacuum reflow furnace 100.

The following will describe a control method of the vacuum soldering apparatus according to the invention with reference to FIGS. 12 through 17, wherein a control example of the vacuum reflow furnace 100 will be described. FIG. 12 shows a temperature profile of the vacuum reflow furnace 100. In FIG. 12, a vertical axis indicates work temperature T [degrees C.] in each of the preliminary heating zones I through IV, the main heating zone V, the vacuum defoaming and/or deaerating zone VI, and the cooling zone VII and a horizontal axis indicates the elapsed time t1 through t7 [seconds]. A solid curve in the drawing indicates temperature characteristics of work in the vacuum reflow furnace 100.

Flow charts shown in FIGS. 13 through 17 relate to control examples on the basis of the work 1. Although other works 1 are processed at the import side of the chamber 40 and the export side thereof at the same time, the description will be performed by paying attention to movement of one work 1 before and after the chamber 40 in order to simplify the description thereof.

In the control method of the vacuum soldering apparatus according to this embodiment, the work 1 is soldered under vacuum environment wherein the four evacuation control properties (#1 through #4) shown in FIG. 6 are previously prepared in the preliminary evacuation process and the control data D62 is tabled and stored in the storage portion 62.

The following evacuation conditions are set by the control portion 61.

(i) By the operation part 21, the setting of the evacuation control with gradients θ is received. For example, as shown in FIG. 6, the cases in which four evacuation control properties (#1 through #4) are selected and the evacuation control with the gradient θ4 is initially set; three evacuation control properties (#1 through #3) are selected and the evacuation control with the gradient θ3 is initially set; and two evacuation control properties (#1 and #2) are selected and the evacuation control with the gradient θ2 is initially set, will be exemplified.

(ii) Before the work 1 enters into the chamber 40, the work is heated up to a predetermined temperature.

(iii) When the work 1 enters into the chamber 40, the predetermined temperature which the work 1 has before it has entered into the chamber 40 is maintained.

(iv) The control portion 61 observes the gradient θ of the evacuation control property to be changed in real time. The control portion always compares the initially set gradient θ in the evacuation control property with the gradient θ of the evacuation control property to be changed and changes the control from the evacuation control property of small pump output to the evacuation control property of large pump output when both of the gradients θ, θ of the control properties are agreed with each other.

Figure 13:
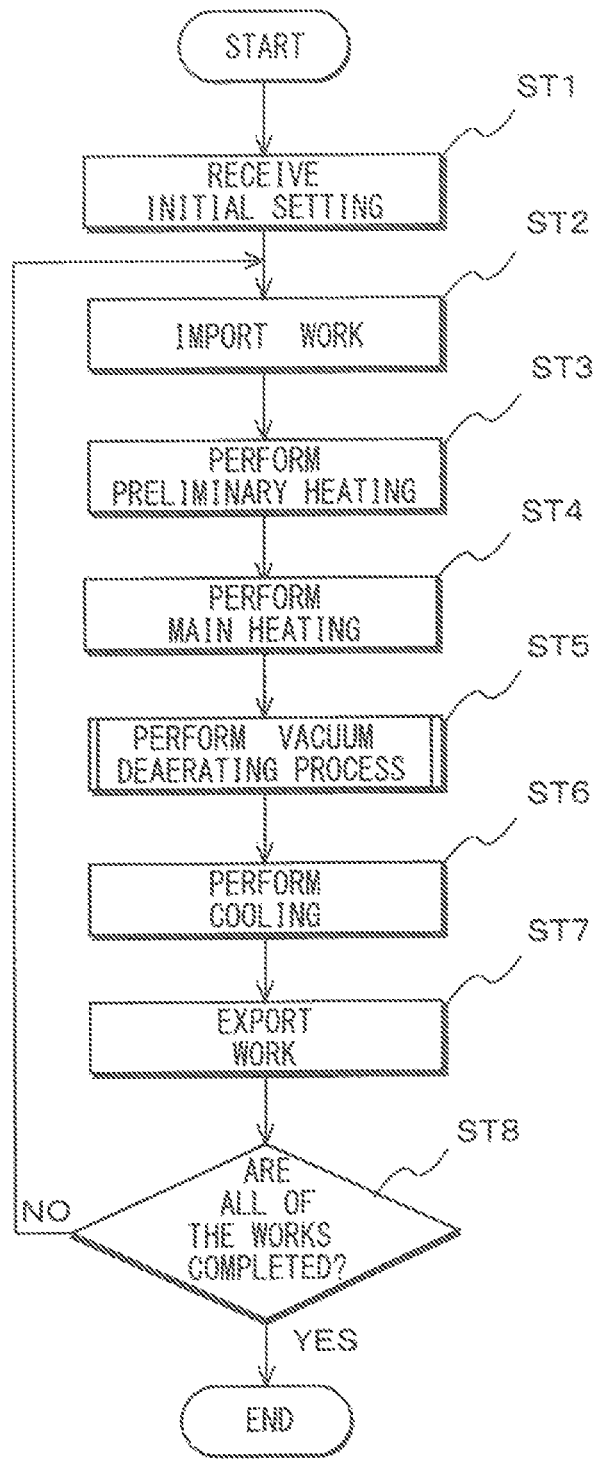
FIG. 13 is a flow chart showing a control example (main routine) of the vacuum reflow furnace 100.
Figure 14:
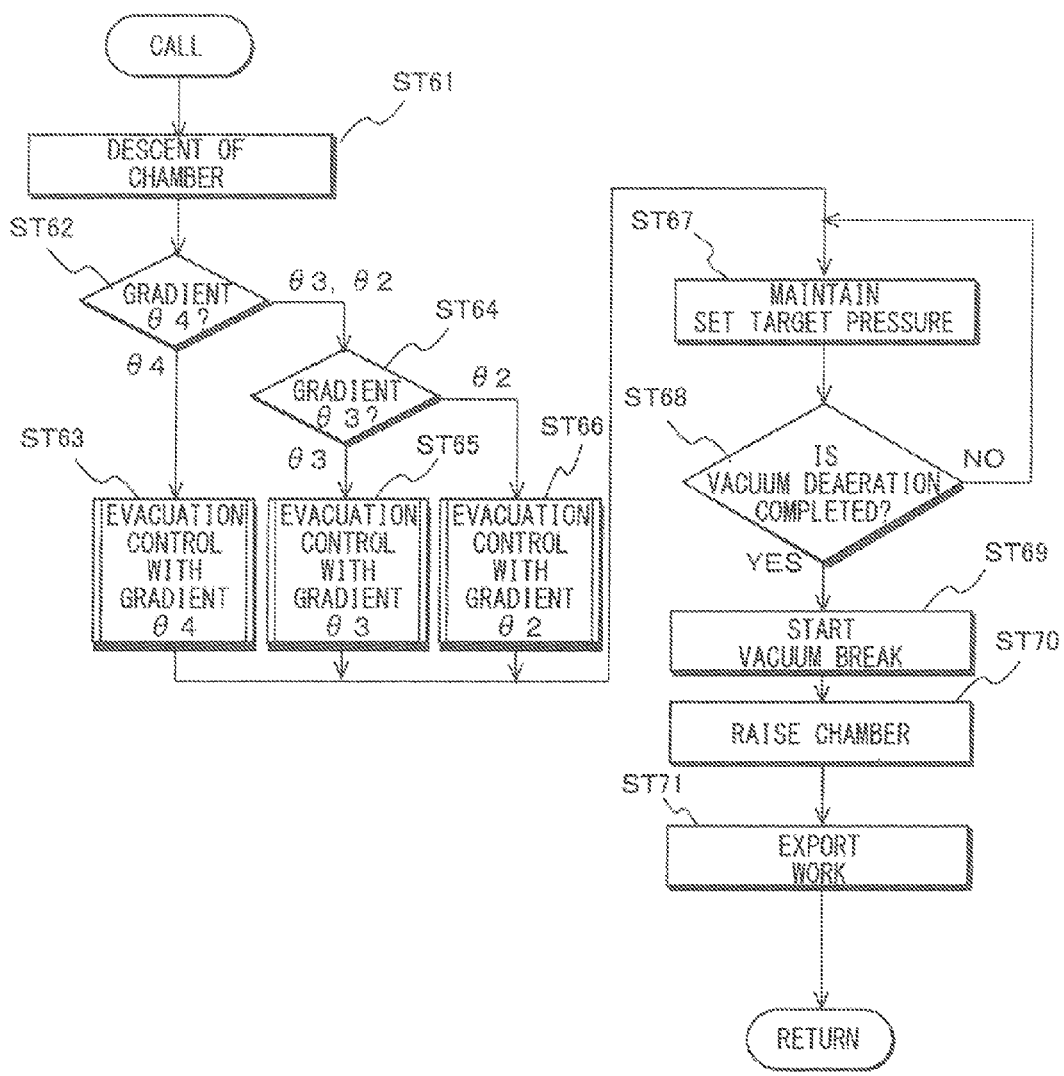
FIG. 14 is a flow chart showing a control example (subroutine) of the vacuum reflow furnace 100.

Under these control conditions of the vacuum soldering process, at a step ST1 shown in FIG. 13, the control portion 61 receives the initial setting. In this initial setting, using the operation part 21, any of the four evacuation control properties (#1 through #4) with a desired gradient θ is selected for the control portion 61 among the four evacuation control properties (#1 through #4) with the gradient θ1 through θ4. The user selects the evacuation control property having the desired gradient θ among the evacuation control properties (#1 through #4 and the like) in the order of descending numbers (in the order of smaller frequency of pump output) to initially set the evacuation control property with the gradient θ. The setting information obtained thereby is output to the control portion 61 as the operation data D21.

At a step ST2, the control portion 61 imports the work 1. By, for example, pushing down a start bottom provided on the operation part 21 by the user, the work 1 is imported. When instructing the start to the control portion 61, the control portion 61 carries out the deriving control on the conveyance mechanism 70. In this moment, the conveyance mechanism 70 receives the conveyance control signal S13 from the control unit 60 and moves the moving beams 18, 28 based on the conveyance control signal S13 to intermittently feed the work 1. The description of the intermittently feeding will be omitted because it is not nature of the invention. When detecting that the work 1 enters into the furnace 100, the arrival detection signal S26 is output to the control unit 60 to start the timer. Based on this timer, it is possible to calculate a position of the work 1 by intermittently feeding time.

At a step ST3, the control portion 61 performs the preliminary heating process on the work 1. In this moment, the preliminary heating portion 20 receives the preliminary heating control signal S20 from the control unit 60 and drives the four preliminary heating zones I through IV based on the preliminary heating portion 20 to gradually heating the work 1 (around 130 degrees C. to around 180 degrees C. through 160 and 170 degrees C.) for attaining the work 1 at a predetermined temperature (for example, 180 degrees C.).

For example, in the preliminary heating zone I, the furnace is heated from ordinary temperature to around 130 degrees C. at points of time t0 to t1 based on the temperature profile shown in FIG. 12. In the preliminary heating zone II, the furnace is heated from around 130 degrees C. to around 160 degrees C. for points of time t1 to t2. In the preliminary heating zone III, the furnace is heated from around 160 degrees C. to around 170 degrees C. for points of time t2 to t3. In the preliminary heating zone IV, the furnace is heated from around 170 degrees C. to around 180 degrees C. for points of time t3 to t4.

At a step ST4, the control portion 61 performs the main heating process on the work 1. In this moment, the main heating portion 30 receives the main heating control signal S30 from the control unit 60 and drives the heaters, the fans and the like in the main heating portion 30 based on the main heating control signal S30 to heat the work 1 to 250 degrees C. According to the temperature profile shown in FIG. 12, the furnace is heated from around 230 degrees C. to around 260 degrees C. for points of time t4 to t5 in the main heating zone IV.

At a step ST5, the control portion 61 performs the vacuum deaerating process on the work 1. In the vacuum deaerating process of this embodiment, the control portion 61 goes to a subroutine shown in FIG. 14.

When going to a step ST61, the control portion 61 performs descent control of the container 41 (chamber descent). The elevating mechanism 43 receives the elevating control signal S43 from the control unit 60 and drives a cylinder, not shown, to make the container 41 tightly enclosed.

Further, the panel heater receives the heater control signal S44 from the control unit 60 and is configured to maintain temperature of the work 1 at 240 degrees C. based on the heater control signal S44. In this embodiment, in the vacuum defoaming and/or deaerating zone VI shown in FIG. 12, the temperature is maintained of around 230 degrees C. to around 250 degrees C. for points of time t5 to t6 in the container 41.

At a step ST62, the control portion 61 then branches the control according to whether or not the evacuation control with the gradient θ4 is initially set or whether or not the other evacuation control with the gradient θ3 or θ2 is initially set. For example, in a case where the four evacuation control properties (#1 through #4) are selected and the evacuation control with the gradient θ4 is initially set, the control portion 61 goes to a step ST63 where it performs the evacuation control with the gradient θ4.

Figure 15:
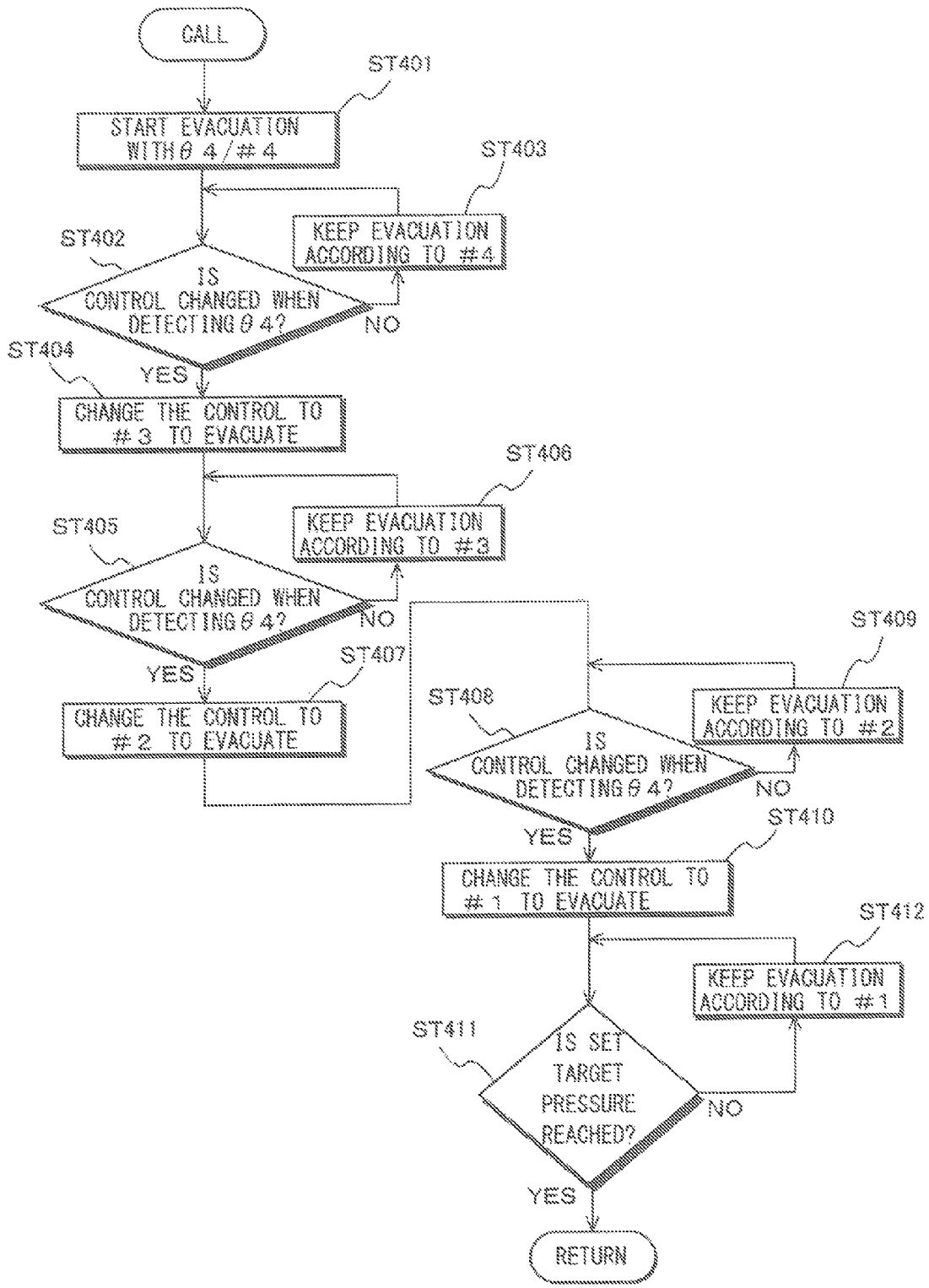
FIG. 15 is a flow chart showing a control example (evacuation control with a gradient θ4) of the vacuum reflow furnace 100.

In this embodiment, the control portion 61 goes to a subroutine shown in FIG. 15 where at a step ST401, it controls the pump output according to the evacuation control property #4 with the gradient θ4 shown in FIG. 7. The pump 23 is driven according to the evacuation control property #4 (20 Hz) with the gradient θ4 at the same time of the control to evacuate the chamber 40.

In this evacuation process, the release valves receive the release valves control signal S25 from the control unit 60 to make an initial release valves and a main release valves "fully opened". The electromagnetic valve 22 receives the electromagnetic valve control signal S22 from the control unit 60 to drive the valve based on the electromagnetic valve control signal S22 so that valve opening position is "full opening position".

The control portion 61 then controls the electromagnetic valve 22 and the pump 23 to evacuate the chamber 40. The pump 23 receives the pump driving voltage V23 from the control unit 60 before and after the time when the valve opening position is a "full opening position" and evacuates to the chamber 40 based on the pump driving voltage V23. For example, the pump 23 operates to pull the air within the container 41 by an evacuation amount according to the evacuation control property #4 (20 Hz) with the gradient θ4.

Next, at a step ST402, the control portion 61 detects the gradient θ4 in a graph of the next evacuation control property #3. In this embodiment, the control portion 61 sets the pointer shown in FIG. 6 at the same time of the evacuation start to scroll the cursor n-m and detects pressure P1 (=57000 [Pa]) which is a change point when the gradient of the graph in the evacuation control property #3 becomes θ4 (see FIG. 7).

If this pressure P1 is not detected, it goes back to a step ST403 where the evacuation is kept according to the evacuation control property #4. If the control portion 61 detects the gradient θ4 in a graph of the evacuation control property #3 at the step ST402, it goes to a step ST404 where the control portion 61 changes the control so that the evacuation control property #4 is succeeded to the evacuation control property #3 at a point of the pressure P1 when detecting the gradient θ4 (first time). Even in the evacuation control property #3, the gradient θ4 of the initially setting time is kept and the pump 23 is driven following the evacuation control property #3 (30 Hz).

At a step ST405, the control portion 61 then detects the gradient θ4 in a graph of the next evacuation control property #2. In this embodiment, the control portion 61 continues to scroll the cursor n-m shown in FIG. 6 after the first control change and detects the gradient θ4 in a graph of the evacuation control property #2. In this embodiment, the control portion 61 detects pressure P2 (=43000 [Pa]) which is a change point when the gradient of the graph in the evacuation control property #2 becomes θ4 (see FIG. 7).

If this pressure P2 is not detected, it goes back to a step ST406 where the evacuation is kept according to the evacuation control property #3. If the control portion 61 detects the gradient θ4 in a graph of the evacuation control property #2 at the step 405, it goes to a step ST407 where the control portion 61 changes the control so that the evacuation control property #3 is succeeded to the evacuation control property #2 at a point of the pressure P2 when detecting the gradient θ4 (second time). Even in the evacuation control property #2, the gradient θ4 of the initially setting time is kept and the pump 23 is driven following the evacuation control property #2 (40 Hz).

At a step ST408, the control portion 61 then detects the gradient θ4 in a graph of the next evacuation control property #1. In this embodiment, the control portion 61 continues to scroll the cursor n-m shown in FIG. 6 after the second control change and detects the gradient θ4 in a graph of the evacuation control property #1. In this embodiment, the control portion 61 detects pressure P3 (=27000 [Pa]) which is a change point when the gradient of the graph in the evacuation control property #1 becomes θ4 (see FIG. 7).

If this pressure P3 is not detected, it goes back to a step ST409 where the evacuation is kept according to the evacuation control property #2. If the control portion 61 detects the gradient θ4 in a graph of the evacuation control property #1 at the step 408, it goes to a step ST410 where the control portion 61 changes the control so that the evacuation control property #2 is succeeded to the evacuation control property #1 at a point of the pressure P3 when detecting the gradient θ4 (third time). Even in the evacuation control property #1, the gradient θ4 of the initially setting time is kept and the pump 23 is driven following the evacuation control property #1 (60 Hz).

At a step ST411, the control portion 61 branches the control according to whether or not the chamber 40 reaches the set target pressure Pf (for example, Pf=10000 [Pa]). If the chamber 40 does not reach the set target pressure Pf, it goes back to a step ST412 where the evacuation according to the evacuation control property #1 is continued. If the set target pressure Pf is reached at the step ST411, it goes back to the step ST63 of the subroutine. Under the evacuation control with the gradient θ4, the evacuation control properties #4 to #1 through #2 and #3 are succeeded so that it is possible to evacuate the chamber 40 to the specified set target pressure Pf in brief time.

If the evacuation control with the gradient θx (x=2 or 3) other than the evacuation control with the gradient θ4 is initially set at the above-mentioned step ST62, the control portion 61 goes to a step ST64 where it branches the control according to whether or not the evacuation control with the gradient θ3 is initially set or whether or not the other evacuation control with the gradient θ2 is initially set. For example, in a case where the three evacuation control properties (#1 through #3) are selected and the evacuation control with the gradient θ3 is initially set, the control portion 61 goes to a step ST65 where it performs the evacuation control with the gradient θ3.

Figure 16:
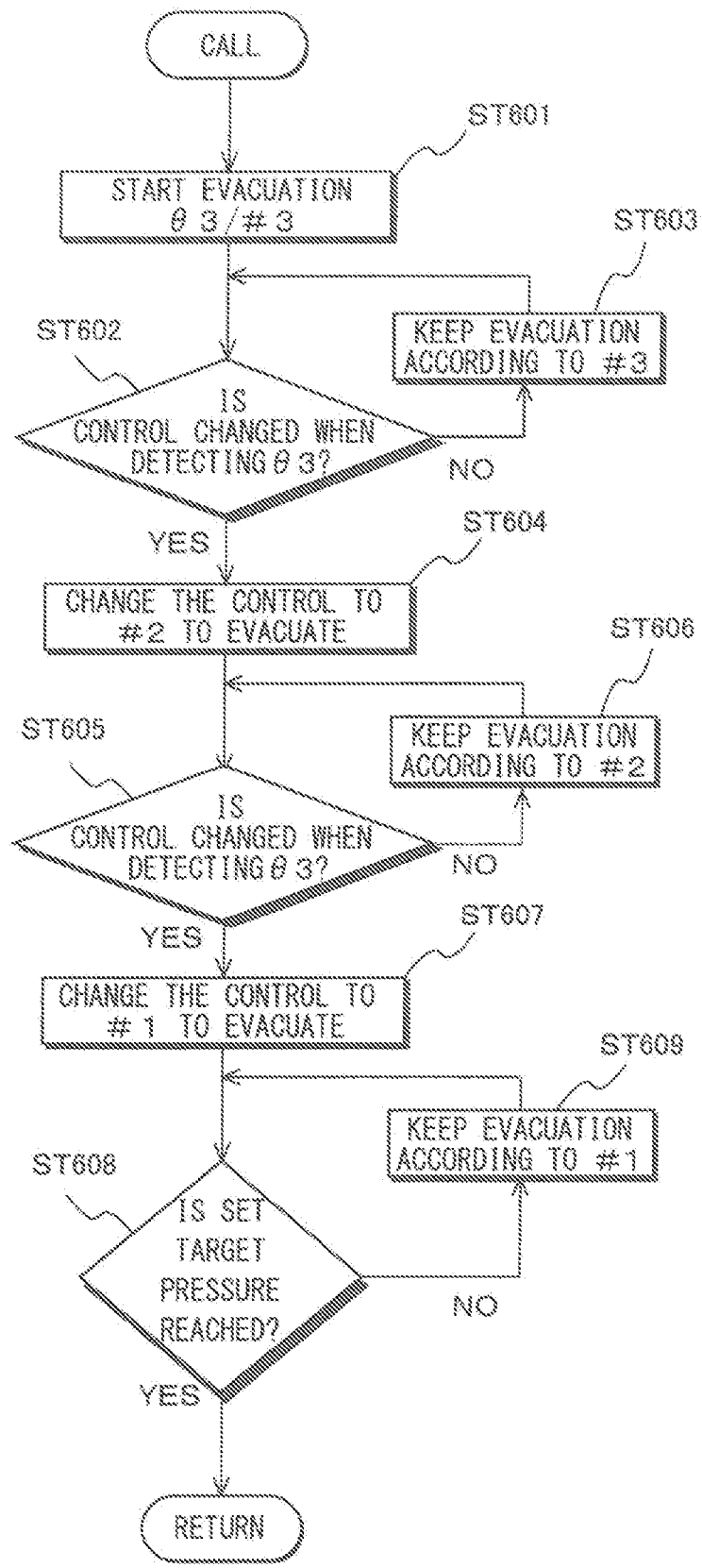
FIG. 16 is a flow chart showing a control example (evacuation control with a gradient θ3) of the vacuum reflow furnace 100.
Figure 17:
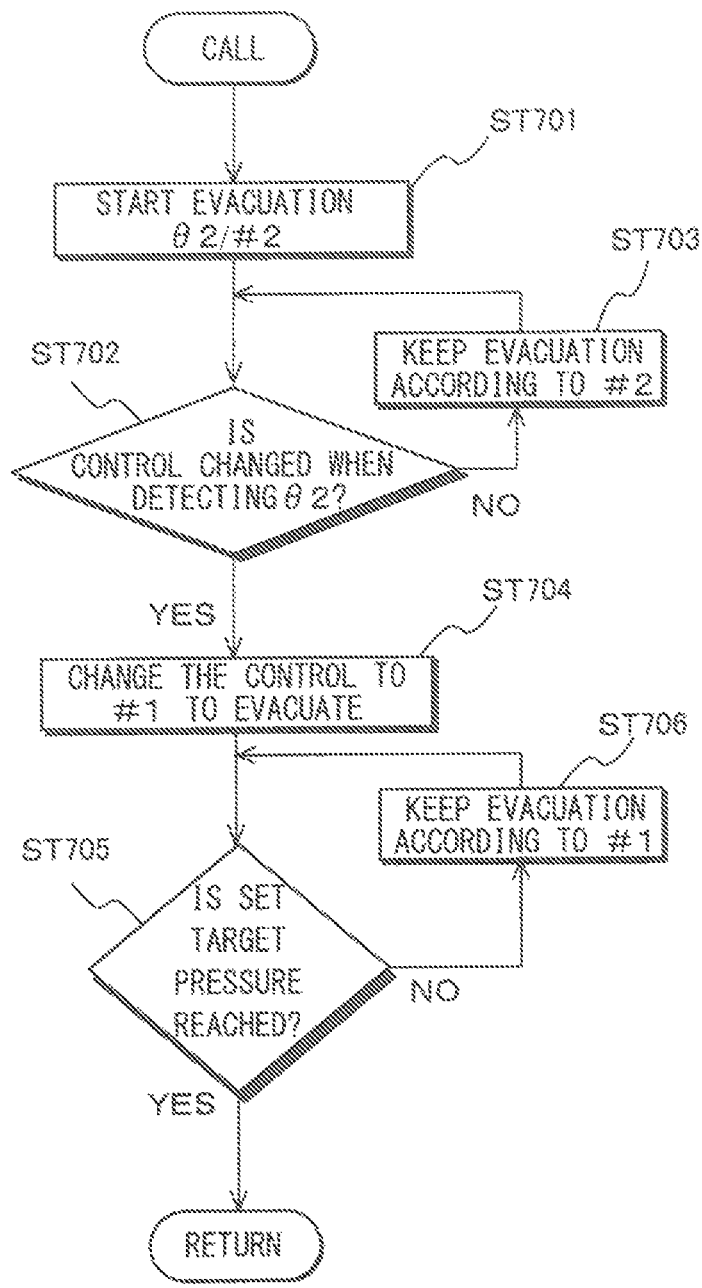
FIG. 17 is a flow chart showing a control example (evacuation control with a gradient θ2) of the vacuum reflow furnace 100.
Figure 19A:
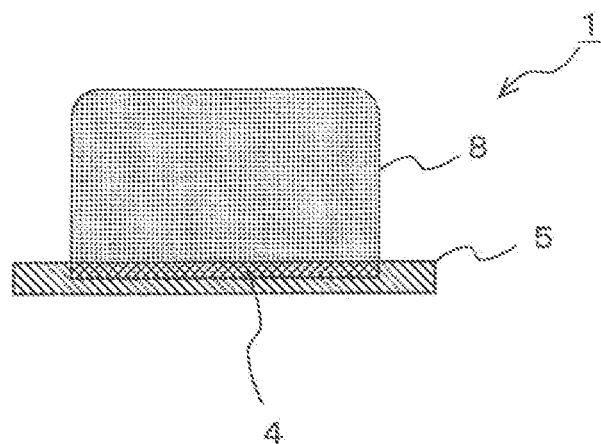
FIG. 19A is a process diagram for showing a past hot blast reflow example (Part one).
Figure 19B:
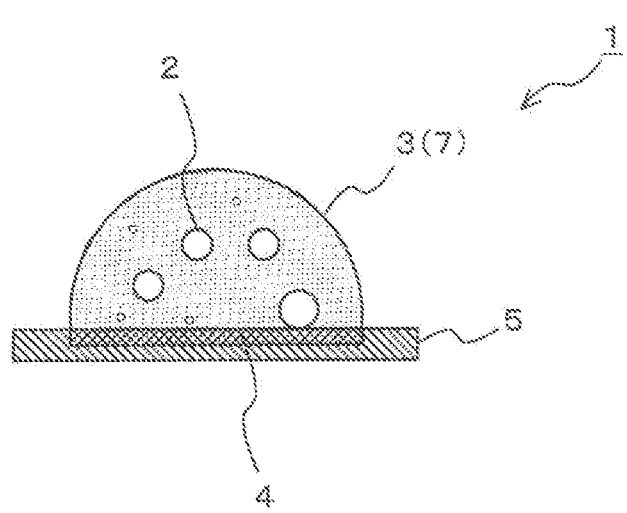
FIG. 19B is a process diagram for showing the past hot blast reflow example (Part two).

In this embodiment, the control portion 61 goes to a subroutine shown in FIG. 16 where at a step ST601, it controls the pump output according to the evacuation control property #3 with the gradient θ3 shown in FIG. 8. The pump 23 is driven according to the evacuation control property #3 (30 Hz) with the gradient θ3 at the same time of the control start.

Next, at a step 602, the control portion 61 detects the gradient θ3 in a graph of the next evacuation control property #2. In this embodiment, the control portion 61 sets the pointer shown in FIG. 6 at the same time of the evacuation start to scroll the cursor n-m and detects pressure P1 (=50000 [Pa]) which is a change point when the gradient of the graph in the evacuation control property #2 becomes θ3 (see FIG. 8).

If this pressure P1 is not detected, it goes back to a step ST603 where the evacuation is kept according to the evacuation control property #3. If the control portion 61 detects the gradient θ3 in a graph of the evacuation control property #2 at the step 602, it goes to a step ST604 where the control portion 61 changes the control so that the evacuation control property #3 is succeeded to the evacuation control property #2 at a point of the pressure P1 when detecting the gradient θ3 (first time). Even in the evacuation control property #2, the gradient θ3 of the initially setting time is kept and the pump 23 is driven following the evacuation control property #2 (40 Hz).

At a step ST605, the control portion 61 then detects the gradient θ3 in a graph of the next evacuation control property #1. In this embodiment, the control portion 61 continues to scroll the cursor n-m shown in FIG. 6 after the first control change and detects the gradient θ3 in a graph of the evacuation control property #1. In this embodiment, the control portion 61 detects pressure P2 (=27000 [Pa]) which is a change point when the gradient of the graph in the evacuation control property #1 becomes θ (see FIG. 8).

If this pressure P2 is not detected, it goes back to a step ST606 where the evacuation is kept according to the evacuation control property #2. If the control portion 61 detects the gradient θ3 in a graph of the evacuation control property #1 at the step 605, it goes to a step ST607 where the control portion 61 changes the control so that the evacuation control property #2 is succeeded to the evacuation control property #1 at a point of the pressure P2 when detecting the gradient θ3 (second time). Even in the evacuation control property #1, the gradient θ3 of the initially setting time is kept and the pump 23 is driven following the evacuation control property #1 (60 Hz).

At a step ST608, the control portion 61 branches the control according to whether or not the chamber 40 reaches the set target pressure Pf. If the chamber 40 does not reach the set target pressure Pf, it goes back to a step ST609 where the evacuation according to the evacuation control property #1 is continued. If the set target pressure Pf is reached at the step ST608, it goes back to the step ST65 of the subroutine. Under the evacuation control with the gradient θ3, the evacuation control properties #3 to #1 through #2 are succeeded so that it is possible to evacuate the chamber 40 to the specified set target pressure Pf in brief time.

If the evacuation control with the gradient θ2 is initially set at the above-mentioned step ST64, the control portion 61 goes to a step ST66 where it performs the evacuation control with the gradient θ2. For example, in a case where the two evacuation control properties (#1 and #2) are selected and the evacuation control with the gradient θ2 is initially set, the control portion 61 goes to the step ST66. In this embodiment, the control portion 61 goes to a subroutine shown in FIG. 17 where at a step ST701, it controls the pump output according to the evacuation control property #2 with the gradient θ2 shown in FIG. 11. The pump 23 is driven according to the evacuation control property #2 (40 Hz) with the gradient θ2 at the same time of the control start.

At a step ST702, the control portion 61 then detects the gradient θ2 in a graph of the next evacuation control property #1. In this embodiment, the control portion 61 continues to scroll the cursor n-m shown in FIG. 6 at the same time of the evacuation start and detects pressure P1 (=40000 [Pa]) which is a change point when the gradient of the graph in the evacuation control property #1 becomes θ2 (see FIG. 11).

If this pressure P1 is not detected, it goes back to a step ST703 where the evacuation is kept according to the evacuation control property #2. If the control portion 61 detects the gradient θ2 in a graph of the evacuation control property #1 at the step 702, it goes to a step ST704 where the control portion 61 changes the control so that the evacuation control property #2 is succeeded to the evacuation control property #1 at a point of the pressure P1 when detecting the gradient θ2. Even in the evacuation control property #1, the gradient θ2 of the initially setting time is kept and the pump 23 is driven following the evacuation control property #1 (60 Hz).

At a step ST705, the control portion 61 branches the control according to whether or not the chamber 40 reaches the set target pressure Pf. If the chamber 40 does not reach the set target pressure Pf, it goes back to a step ST706 where the evacuation according to the evacuation control property #1 is continued. If the set target pressure Pf is reached at the step ST705, it goes back to the step ST66 of the subroutine. Under the evacuation control with the gradient θ2, the evacuation control properties #2 to #1 are succeeded so that it is possible to evacuate the chamber 40 to the specified set target pressure Pf in brief time.

Further, at a step ST67, the control portion 61 maintains the set target pressure Pf for a predetermined time. Here, the control portion 61 adjusts the electromagnetic valve 22 and the release valves 25 to maintain the vacuum in the chamber 40 at the set target pressure Pf for vacuum maintaining time. The vacuum maintaining time is maximum settable time when the set target pressure Pf can be maintained within vacuum processing time without hindrance of intermittent feeding in setting of the vacuum processing time calculated as work multiplied by intermittent waiting unit time. If the time calculated as work multiplied by intermittent waiting unit time is short, throughput of the vacuum reflow furnace is improved.

At a step ST68, the control portion 61 then determines whether or not the vacuum deaerating process is completed. In this moment, for example, in a case of this embodiment, since the work 1 is intermittently fed, it is determined on the basis of the set intermittent feeding time. Accordingly, it is possible to solder (remove voids) while the vacuum in the chamber 40 is maintained at fixed atmospheric pressure for specified time (vacuum deaerating process).

If the intermittent feeding time is elapsed, the control portion 61 stops the observation and starts vacuum break in the chamber 40 at a step ST69. In this vacuum break, for example, the pump 23 stops, the release valves 25 operate and N$_2$ gas is supplied to the chamber 40 so that the vacuum pressure in the container 41 raises on with a fixed ratio (like a linear function) (see a linear characteristic shown in FIG. 7).

If the vacuum pressure in the chamber 40 becomes atmospheric pressure, the control portion 61 goes to a step ST70 where it controls the elevating mechanism 43 to raise the container 41. The elevating mechanism 43 receives the elevating control signal S43 from the control unit 60 and operates a cylinder, not shown, or the like based on the elevating control signal S43 to make the container 41 opened.

At a step ST71, the control portion 61 then performs the export process on the work. The conveyance mechanism 70 receives the conveyance control signal S13 from the control unit 60 and moves the moving beam 28 based on the conveyance control signal S13 to intermittently feed the work 1 (see FIG. 5). When the work 1 is carried out of the base 42, the conveyance mechanism 70 is configured to carry a next work 1 onto the base 42.

If the work 1 is forwarded to the cooling portion 50, it returns to the step ST5 of the main routine and goes to a step ST6. At the step ST6, the control portion 61 performs cooling process on the work 1. In this moment, the cooling portion 50 receives the cooling control signal S50 from the control unit 60 and operates the heat exchangers, the fans and the like based on the cooling control signal S50 to cool the work 1. Accordingly, it is possible to cool the work 1 at desired temperature, 60 degrees C.

At a step ST7, the control portion 61 controls the conveyance mechanism 70 so as to export the work 1 from the cooling portion 50 to outside. At a step ST8, the control portion 61 determines whether or not the vacuum soldering process of all the works 1 are completed. If the vacuum soldering process of all the works 1 is not completed, it returned to the step ST2 where the carry-in process of the work 1, the heating process thereof, the vacuum deaerating process thereof and the cooling process thereof are continued. If the vacuum soldering process of all the works 1 is completed, it finishes the control.

By the vacuum reflow furnace 100 and the control method thereof according to the embodiment, the four vacuum control properties #1 through #4 are previously prepared and the control portion 61 is provided to perform the evacuation control on the pump 23. The control portion 61 is configured to perform the pump output control by the vacuum control property with the gradient θ, to observe the gradient θ in real time with the evacuation control property with the gradient θ to be changed, and to change from the evacuation control property of small pump output to the evacuation control property of large pump output based on the initially set gradient θ of the evacuation control property.

By such control, it is possible to enlarge the selectivity of the evacuation conditions and evacuate the chamber to specified set target pressure Pf at brief time. Thereby, the throughput of the chamber can be adjusted. On the other hand, it is possible to suppress an occurrence of voids and prevent scattering of flux, components or the like. In the above-mentioned embodiments, Any voids in the molten solder reaching the set target pressure Pf are gradually defoamed and/or deaerated by the evacuation with the evacuation control properties with the gradient θ which is plotted by the evacuation time in relation to the degree of vacuum when evacuating the chamber with a predetermined pump output. Thereby, it is possible to prevent flux scattering, solder scattering or the like and it is possible to perform the high quality vacuum soldering with less voids under the set degree of vacuum.

Further, although a method of, in the above embodiments, observing the gradient θ of the evacuation control property to be changed, in real time and to change the evacuation control property based on this observation has been described, it is not limited thereto: The control portion 61 may refer to the evacuation control property based on the vacuum pressure detection signal S24 and change the pump output from the evacuation control property having large gradient θ to the evacuation control property having small gradient θ when the vacuum pressure in the chamber reaches the change point of the degree of vacuum of the evacuation control property.

For example, the control portion 61 obtains the above-mentioned four evacuation control properties #1 through #4 at the preliminary evacuation time and produces the table shown in FIG. 6. From the table, the pointer for change the evacuation control properties with the initially set gradient θ is previously found out (calculated). The storage portion 62 stores the control data D62 of the change points, which have been obtained by this calculation. FIG. 18 shows this storage example.

In this embodiment, the gradients θ (=θ4, θ3, θ2 . . . ) with respect to combination examples of the evacuation control properties, namely, the evacuation control properties #→#3→#2→#1, the evacuation control properties #4→#3→#1, the evacuation control properties #4→#2→#1, the evacuation control properties #4→#1, the evacuation control properties #3→#2→#1, the evacuation control properties #3→#2, the evacuation control properties #3→#1, the evacuation control properties #2→#1 can be set. Of course, the evacuation control properties are not limited to four properties #4, #3, #2 and #1.

At main evacuation time, the control portion 61 performs a step of detecting the vacuum pressure in the chamber 40 and referring to the tabled evacuation control properties #1 through #4 based on pressure detection information (vacuum pressure detection signal S24) and a step of changing the pump output from the evacuation control property having large gradient θ to the evacuation control property having small gradient θ when the vacuum pressure (degree of the vacuum) in the chamber 40 reaches the change point for changing the evacuation control properties.

For example, in an item of pump output control shown in FIG. 18, P43 in the parenthesis indicates vacuum pressure of the change point from the evacuation control property #4 to the evacuation control property #3 when performing the evacuation control property #4. While performing the control by the control property #4, the control portion 61 is configured to change the evacuation control property #4 to the evacuation control property #3 so as to take over the control at the time when the vacuum pressure detection signal S24 indicating the vacuum pressure P43 is detected.

P32 indicates vacuum pressure of the change point from the evacuation control property #3 to the evacuation control property #2 when performing the evacuation control property #3. The control portion 61 is configured to change the control from the evacuation control property #3 to the evacuation control property #2 at the time when the vacuum pressure detection signal S24 indicating the vacuum pressure P32 is detected.

P21 indicates vacuum pressure of the change point from the evacuation control property #2 to the evacuation control property #1 when performing the evacuation control property #2. The control portion 61 is configured to change the control from the evacuation control property #2 to the evacuation control property #1 at the time when the vacuum pressure detection signal S24 indicating the vacuum pressure P21 is detected. All of the vacuum pressures P43, P32 and P21 are previously obtained from the tabled evacuation control properties #1 through #4 before the main evacuation.

Other combination examples of the evacuation control properties are similarly defined and applied, the description of which will be omitted. The storage portion 62 stores these programs and the control data D62. By the control, it is also possible to evacuate the chamber 40 to the specified set target pressure Pf in brief time. It is further possible to reduce load of the control portion 61 from the control to observe the gradient θ in real time to the control to detect the vacuum pressure detection signal S24.

In addition, in the invention, a plurality of the evacuation control properties with the gradients θ plotting the degree of vacuum in relation to the evacuation time when evacuating the chamber 40 by a predetermined pump output is previously prepared, and the control portion 61 which performs evacuation control of the pump so that the evacuation control property of small pump output is changed to the evacuation control property of large pump output based on the initially set gradient θ of the evacuation control property is provided. Accordingly, even if the evacuation control property having the initially set gradient θ becomes a gradient more than the gradient θ by a predetermined gradient (for example, +around 20% through around 50%: hereinafter, referred to as "threshold gradient θth"), it can be also applied to a case of change to other evacuation control property.

Here, the threshold gradient θth is a change evaluation criterion which differs on the basis of setting number of the evacuation control properties or the property selected from the plurality of the set control properties. In a case of the evacuation properties #4 to #1 through #2 and #3, which have been described above, the threshold gradient θth can be preferably set so as to be within a range of 20% through 50%, preferably 30% through 50%. In a case of the evacuation properties #4 to #1 through #3, the threshold gradient θth can be preferably set so as to be within a range of 30% through 40%, on the basis of the balance between a rate of incidence of the voids, evacuation time and the like.

Namely, in the control method of the vacuum reflow furnace, the control portion 61 is configured to always compare the initially set gradient θ in the evacuation control properties with the above-mentioned threshold gradient θth during the evacuation and to change the control from the evacuation control property of small pump output to the evacuation control property of large pump output when the initially set gradient θ of the evacuation control properties exceeds the threshold gradient θth. By this control, it is possible to enlarge the selectivity of the above-mentioned evacuation conditions and evacuate the chamber to specified set target pressure Pf at brief time.

INDUSTRIAL APPLICABILITY

This invention is very preferably applicable to a vacuum reflow furnace which has a function to defoam and/or deaerate vacuum molten solder when soldering surface mounting components or the like on a substrate while mounting the components on predetermined positions of the substrate.

EXPLANATION OF CODES

10: main body
11: inlet
12: outlet
13: conveying portion
16: conveying path
17, 27: fixed beam
18, 28: moving beam
20: preliminary heating portion
21: operation part
23: pump
24: vacuum pressure sensor
25: release valves
26: arrival sensor
29: gas-supplying portion
30: main heating portion (heating portion)
40: chamber
41: container
42: base
43: elevating mechanism
44: panel heater
45, 46: fixed beams
47: pins
48: seal member
50: cooling portion
100: vacuum reflow furnace (vacuum soldering apparatus)

The invention claimed is:

1. A vacuum soldering apparatus comprising:
a chamber that is capable of soldering a work under vacuum environment;
an operation part that sets a condition of evacuating the chamber;
a pump that evacuates the chamber based on the condition of evacuating the chamber; and
a control portion that performs an evacuation control of the pump wherein a plurality of evacuation control properties with gradients θ are previously prepared, each gradient θ corresponding to a degree of vacuum in relation to evacuation time when the chamber is evacuated by a predetermined pump output, and
the control portion changes from the evacuation control property of a first pump output to the evacuation control property of a second pump output based on an initially set gradient θ in the evacuation control property, wherein the second pump output is greater than the first pump output.

2. The vacuum soldering apparatus according to claim 1 wherein the control portion observes the gradient θ of the evacuation control property to be changed, and
the control portion always compares the initially set gradient θ in the evacuation control property with the gradient θ of the evacuation control property to be changed and changes the control from the evacuation control property of the first pump output to the evacuation control property of the second pump output when both of the gradients θ of the evacuation control properties are the same.

3. The vacuum soldering apparatus according to claim 1 further comprising a detection portion that detects vacuum pressure of the chamber and outputs pressure detection information; and
a storage portion that stores data in which the evacuation control properties are tabled,
wherein the control portion refers to the evacuation control properties based on the pressure detection information, and
the control portion changes the pump output from the evacuation control property with the second gradient θ to the evacuation control property with the first gradient θ when the vacuum pressure in the chamber reaches a change point of the degree of vacuum in the evacuation control property.

4. The vacuum soldering apparatus according to claim 1 wherein the control portion always compares the initially set gradient θ in the evacuation control property with a threshold gradient θth which is a change evaluation criterion, in evacuation; and
the control portion changes the control from the evacuation control property of the first pump output to the evacuation control property of the second pump output when the initially set gradient θ of the evacuation control property exceeds the threshold gradient θth.

5. A control method of a vacuum soldering apparatus wherein a control portion of the vacuum soldering apparatus that solders a work under vacuum environment performs the method comprising:
a step of obtaining and storing a plurality of evacuation control properties with gradients θ, each gradient θ plotting degree of vacuum in relation to evacuation time when a chamber for soldering is evacuated by a predetermined pump output;

a step of setting the evacuation control properties with the gradient θ; and a step of controlling the pump output to change from the evacuation control property of the first pump output to the evacuation control property of the second pump output based on the gradient θ in the set evacuation control properties.

6. The control method of the vacuum soldering apparatus according to claim 5 wherein the control portion performs:

a step of obtaining the evacuation control properties at preliminary evacuation to prepare a table;

a step of observing the gradient θ of the evacuation control property to be changed at main evacuation;

a step of always comparing the initially set gradient θ in the evacuation control property with the gradient θ of the evacuation control property to be changed; and a step of changing the control from the evacuation control property of the first pump output to the evacuation control property of the second pump output when both of the gradients θ of the evacuation control properties are agreed with each other in evacuation.

7. The control method of the vacuum soldering apparatus according to claim 5 wherein at preliminary evacuation, the control portion performs:

a step of obtaining the evacuation control properties to prepare a table; and a step of finding out a change point of the evacuation control properties with the initially set gradient θ, and wherein at main evacuation, the control portion performs:

a step of detecting the vacuum pressure of the chamber and referring to the tabled evacuation control properties based on the pressure detection information, and a step of changing the pump output from the evacuation control property of the second gradient θ to the evacuation control property of the first gradient θ when the vacuum pressure in the chamber reaches the change point of the evacuation control properties.

8. The control method of the vacuum soldering apparatus according to claim 5 wherein the control portion always compares the initially set gradient θ in the evacuation control property with a threshold gradient θth which is a change evaluation criterion during evacuation; and the control portion changes the control from the evacuation control property of the first pump output to the evacuation control property of the second pump output when the initially set gradient θ of the evacuation control property exceeds the threshold gradient θth.

* * * * *